US012550655B2

(12) United States Patent
Ono et al.

(10) Patent No.: US 12,550,655 B2
(45) Date of Patent: Feb. 10, 2026

(54) METHOD FOR MANUFACTURING SEMICONDUCTOR DEVICE AND SEMICONDUCTOR DEVICE

(71) Applicant: KIOXIA CORPORATION, Tokyo (JP)

(72) Inventors: Takanobu Ono, Kuwana Mie (JP); Masaki Sekine, Mie Mie (JP); Kizashi Tanioka, Yokkaichi Mie (JP); Takaaki Akahane, Inabe Mie (JP)

(73) Assignee: KIOXIA CORPORATION, Tokyo (JP)

( * ) Notice: Subject to any disclaimer, the term of this patent is extended or adjusted under 35 U.S.C. 154(b) by 670 days.

(21) Appl. No.: 17/894,820

(22) Filed: Aug. 24, 2022

(65) Prior Publication Data
US 2023/0187279 A1    Jun. 15, 2023

(30) Foreign Application Priority Data
Dec. 9, 2021   (JP) .................. 2021-200229

(51) Int. Cl.
  *H10B 43/20* (2023.01)
  *H01L 21/304* (2006.01)
  *H01L 21/78* (2006.01)
  *H10B 43/35* (2023.01)
  *H10B 43/40* (2023.01)

(52) U.S. Cl.
  CPC .......... *H01L 21/78* (2013.01); *H01L 21/3043* (2013.01); *H10B 43/20* (2023.02); *H10B 43/35* (2023.02); *H10B 43/40* (2023.02)

(58) Field of Classification Search
  CPC ..... H01L 21/78; H01L 21/3043; H10B 43/35; H10B 43/40
  See application file for complete search history.

(56) References Cited

U.S. PATENT DOCUMENTS

| 6,713,154 B1 * | 3/2004 | Tsunogae ................ B32B 27/32 525/298 |
| 6,951,801 B2 | 10/2005 | Pozder et al. |
| 7,696,607 B2 | 4/2010 | Sano et al. |

(Continued)

FOREIGN PATENT DOCUMENTS

| JP | 2021-019180 A | 2/2021 |
| TW | 202131416 A | 8/2021 |
| TW | 202145327 A | 12/2021 |

OTHER PUBLICATIONS

Akira Fukuda, "Two techniques to reduce the difficulty of etching and film formation in memory holes", EE Times Japan, Dec. 21, 2018, URL: https://eetimes.jp/ee/articles/1812/21/news032.html; 7 pages.

Primary Examiner — Mohammad M Choudhry
(74) Attorney, Agent, or Firm — Foley & Lardner LLP

(57) ABSTRACT

A method for manufacturing a semiconductor device includes forming a first stacked body having a plurality of first material films and a plurality of second material films that are alternately stacked, in a divided region of a semiconductor wafer including a chip region in which a semiconductor element is provided and the divided region between the adjacent chip regions, a plurality of times in a normal line direction of a substrate surface of the semiconductor wafer. The semiconductor wafer is fragmented by a blade having a width wider than the width of the first stacked body.

11 Claims, 17 Drawing Sheets

(56) References Cited

U.S. PATENT DOCUMENTS

| | | | |
|---|---|---|---|
| 2004/0201062 A1* | 10/2004 | Hirose | H10D 86/201 |
| | | | 257/E21.703 |
| 2018/0083025 A1* | 3/2018 | Inatsuka | H10B 43/50 |
| 2019/0088715 A1* | 3/2019 | Yamamoto | H10N 70/826 |
| 2020/0058676 A1* | 2/2020 | Ono | H10D 64/037 |
| 2021/0020501 A1 | 1/2021 | Ono et al. | |

* cited by examiner

METHOD FOR MANUFACTURING SEMICONDUCTOR DEVICE AND SEMICONDUCTOR DEVICE

CROSS-REFERENCE TO RELATED APPLICATION(S)

This application is based upon and claims the benefit of priority from Japanese Patent Application No. 2021-200229, filed Dec. 9, 2021, the entire contents of which are incorporated herein by reference.

FIELD

Embodiments described herein relate generally to a method for manufacturing a semiconductor device and the semiconductor device.

BACKGROUND

In the manufacturing process of a semiconductor device, a wafer on which a semiconductor element is formed may be fragmented into a semiconductor chip by dicing. However, dicing defects such as film peeling may occur during dicing. Poor dicing may adversely affect the semiconductor element and may lead to a decrease in yield.

DETAILED DESCRIPTION

Figure 1:
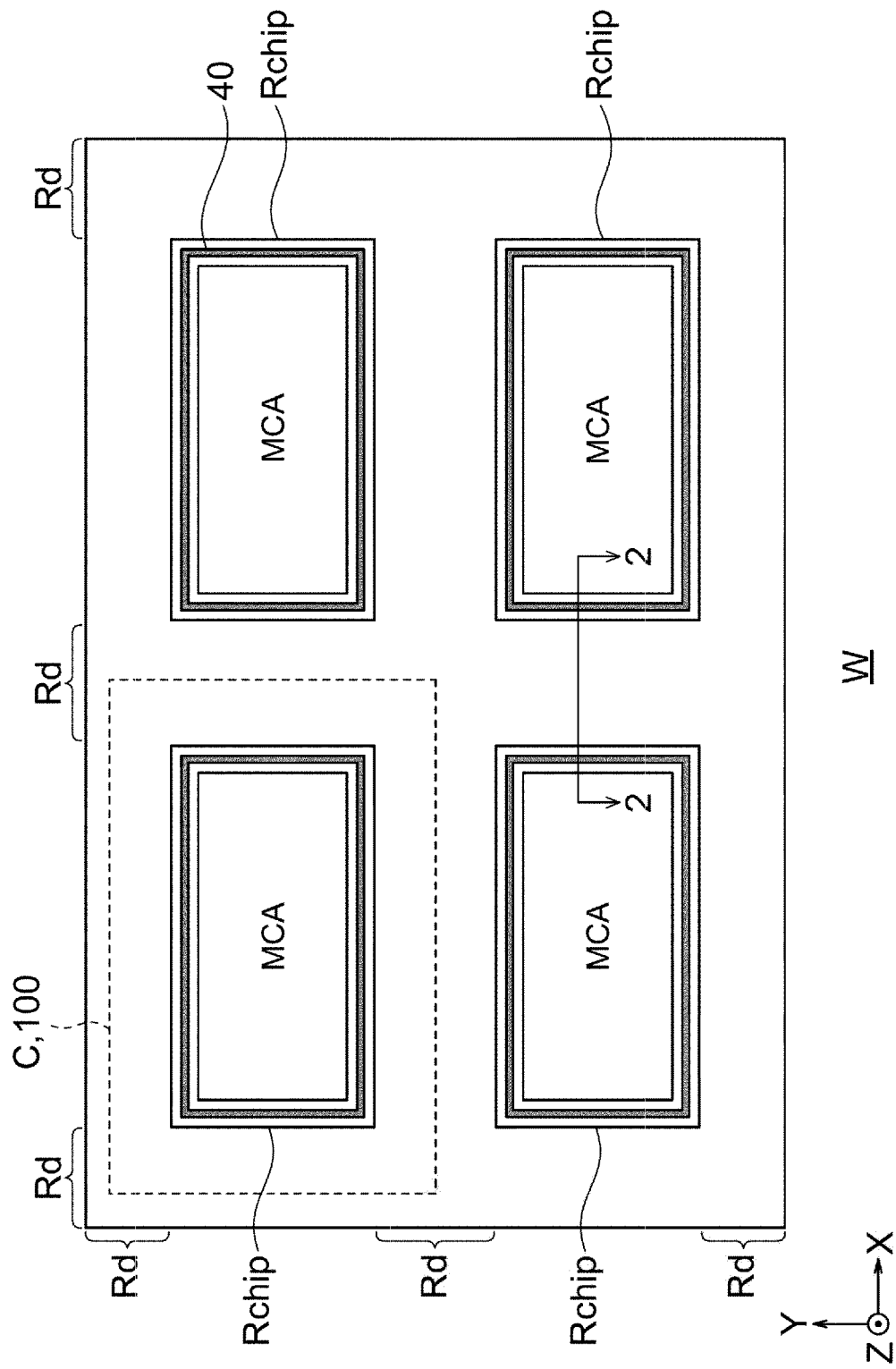
FIG. 1 is a schematic plan view showing an example of a configuration of a part of a semiconductor wafer including a semiconductor device according to a first embodiment.

Embodiments provide a method for manufacturing a semiconductor device capable of more appropriately performing fragmentation and the semiconductor device.

In general, according to at least one embodiment, a method for manufacturing a semiconductor device includes forming a first stacked body having a plurality of first material films and a plurality of second material films that are alternately stacked, in a divided region of a semiconductor wafer including a chip region in which a semiconductor element is provided and the divided region between the adjacent chip regions, a plurality of times in a normal line direction of a substrate surface of the semiconductor wafer. The semiconductor wafer is fragmented by a blade having a width wider than the width of the first stacked body.

Hereinafter, embodiments according to the present disclosure will be described with reference to drawings. The present embodiment is not limited to the present disclosure. In the following embodiments, the vertical direction of a semiconductor substrate indicates a relative direction when the surface on which a semiconductor element is provided is facing up, and may be different from the vertical direction according to the gravitational acceleration. The drawings are schematic or conceptual, and the ratio of each part is not always the same as an actual one. In the specification and the drawings, the same elements as those described above with respect to the existing drawings are designated by the same reference numerals, and a detailed description thereof will be omitted as appropriate.

First Embodiment

FIG. 1 is a schematic plan view showing an example of a configuration of a part of a semiconductor wafer W including a semiconductor device 100 according to a first embodiment. The semiconductor wafer W includes a plurality of chip regions Rchip and a plurality of dicing regions Rd. The chip region Rchip and the dicing region Rd are regions on a surface Fa of the semiconductor wafer W. The chip region Rchip as a semiconductor chip region is provided with semiconductor elements such as a transistor (not shown in FIG. 1) and a memory cell array MCA. The semiconductor elements are formed on the semiconductor wafer W through a semiconductor manufacturing process. The dicing region Rd as a divided region is a linear region between adjacent chip regions Rchip, and is a region cut by dicing. The dicing region Rd is also called a dicing line. According to the present embodiment, blade dicing is performed by a blade BLD passing through the semiconductor wafer W along the dicing region Rd. As a result, the semiconductor wafer W is fragmented for each chip region Rchip and becomes a semiconductor chip C.

Figure 2:
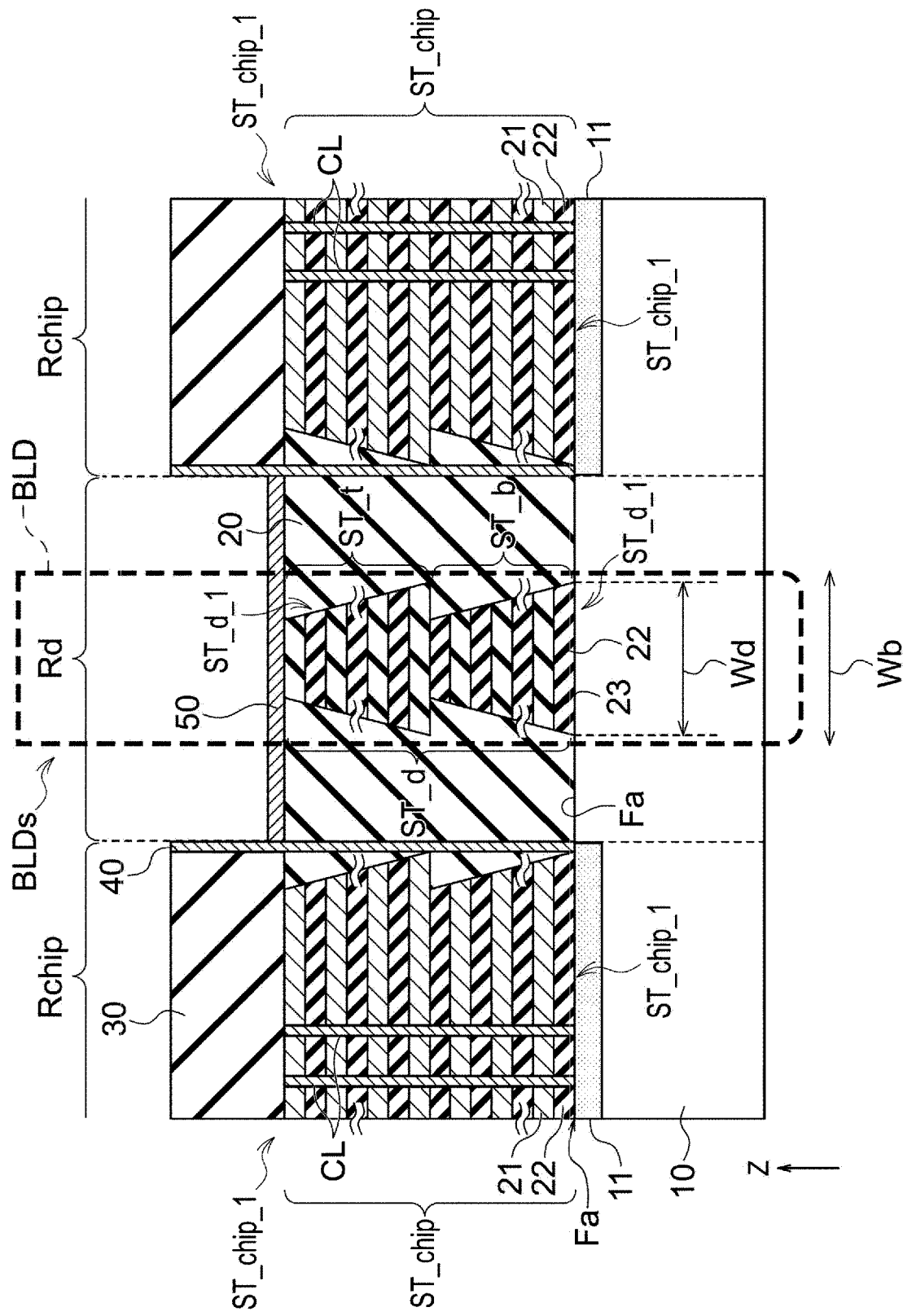
FIG. 2 is a cross-sectional view showing an example of the configuration of the semiconductor wafer according to the first embodiment.

FIG. 2 is a cross-sectional view showing an example of the configuration of the semiconductor wafer W according to the first embodiment. FIG. 2 is a cross-sectional view taken along the line 2-2 of FIG. 1. The semiconductor wafer W includes a substrate 10, a control circuit 11, stacked bodies ST_chip and ST_d, an interlayer insulating film 20, a passivation film 30, a guard ring 40, and a metal film 50. In the present embodiment, the semiconductor wafer W includes, for example, a semiconductor storage device such as a NAND flash memory. The memory cell array MCA of the semiconductor storage device is, for example, a three-dimensional memory cell array in which memory cells are located three-dimensionally. In FIG. 2, the memory cell array MCA is simplified and shown as the stacked body ST_chip for the sake of clarity. Although silicon is exemplified below as a semiconductor, a semiconductor other than silicon may be used.

The substrate 10 is a semiconductor substrate such as a silicon substrate. The substrate 10 indicates a substrate before the semiconductor manufacturing process, and the semiconductor wafer W indicates a substrate after the semiconductor manufacturing process. Therefore, the semiconductor wafer W indicates the substrate 10 including semiconductor elements, an interlayer insulating film, and the like.

The control circuit 11 is provided on the substrate 10 as a part of the semiconductor elements. The control circuit 11 is provided under the stacked body ST_chip and controls the stacked body ST_chip (that is, the memory cell array MCA). The control circuit 11 includes, for example, a complementary metal oxide semiconductor (CMOS) circuit.

The stacked body ST_chip is provided on the chip region Rchip of the substrate 10. The stacked body ST_chip is configured by alternately stacking conductive films 21 and a first insulating film 22, and includes a columnar portion CL therein. A memory cell MC is configured at the intersection of the stacked body ST_chip and the columnar portion CL. The detailed configuration of the columnar portion CL and the memory cell MC will be described later with reference to FIGS. 4 and 5.

The stacked body ST_chip includes a plurality of stages of second stacked bodies ST_chip_1 in a Z direction. The second stacked body ST_chip_1 is a one-stage stacked body provided in the stacked body ST_chip. In the example shown in FIG. 2, the stacked body ST_chip includes a two-stage second stacked body ST_chip_1. In the two-stage second stacked body ST_chip_1, the lower portion of the second stacked body ST_chip_1 is also referred to as a lower stacked body ST_chip_b, and the upper portion of the second stacked body ST_chip_1 is also referred to as an upper stacked body ST_chip_t.

A conductive metal such as tungsten is used for the conductive film 21, and an insulating material such as a silicon oxide film is used for the first insulating film 22 as a first material film. Each of the conductive films 21 functions as a word line. The first insulating film 22 is provided between the conductive films 21 adjacent to the stacked body ST_chip in the stacking direction (Z direction), and electrically separates the conductive films 21.

The stacked body ST_d is provided on the dicing region Rd of the substrate 10. The stacked body ST_d is configured by alternately stacking the first insulating film 22 and a second insulating film 23, and is not provided with the columnar portion CL. The stacked body ST_d may be used, for example, as a test pattern TEG. For the second insulating film 23 as a second material film, a material different from that of the first insulating film 22, for example, an insulating material such as a silicon nitride film is used.

The stacked body ST_d includes a plurality of stages of first stacked bodies ST_d_1 in the Z direction. The first stacked body ST_d_1 is a one-stage stacked body provided in the stacked body ST_d. In the example shown in FIG. 2, the stacked body ST_d includes a two-stage first stacked body ST_d_1. In the two-stage first stacked body ST_d_1, the lower portion of the first stacked body ST_d_1 is also referred to as a lower stacked body ST_b, and the upper portion of the first stacked body ST_d_1 is also referred to as an upper stacked body ST_t.

The interlayer insulating film 20 is provided between the stacked body ST_chip and the stacked body ST_d, and covers the periphery of the stacked body ST_d. For the interlayer insulating film 20, for example, an insulating material such as a TetraEthOxySilane (TEOS) film is used.

The passivation film 30 is provided on the stacked body ST_chip in the chip region Rchip. For the passivation film 30, for example, an insulating material such as polyimide is used.

The guard ring 40 is provided between the chip region Rchip and the dicing region Rd, and extends in the Z direction from the uppermost layer to the lowest layer of the stacked bodies ST_chip and ST_d. The guard ring 40 protects the semiconductor elements on the chip region Rchip side so that cracks generated when the dicing region Rd is cut do not propagate to the chip region Rchip. Therefore, the guard ring 40 is provided over the entire dicing region Rd so as to surround the entire periphery of the chip region Rchip. For the guard ring 40, for example, a single layer of a metal material such as tungsten, copper, aluminum, titanium, and tantalum, or a stacked layer of a plurality of these materials is used.

The metal film 50 is provided on the stacked body ST_d of the dicing region Rd and the interlayer insulating film 20. The metal film 50 functions as an alignment mark at the time of device formation and a pad in the chip region Rchip. For the metal film 50, for example, a metal material such as aluminum is used.

The stacked body ST_d of the dicing region Rd is formed separately from the lower stacked body ST_b and the upper stacked body ST_t. In the cross section perpendicular to the stretching direction of the dicing region Rd, both the lower stacked body ST_b and the upper stacked body ST_t have a taper on the side surface. The widths of the side surfaces of the lower stacked body ST_b and the upper stacked body ST_t become narrower in the upward direction (from the lower layer to the upper layer) in the stacking direction, respectively. The "width" here is a width in a direction (X or Y direction) substantially perpendicular to the stacking direction of the stacked body ST_d.

The stacked body ST_chip of the chip region Rchip is different from the stacked body ST_d in the planar layout, but is the same in that the stacked body ST_chip is formed separately from the lower stacked body and the upper stacked body. The side surfaces of the lower stacked body and the upper stacked body of the stacked body ST_chip have the same taper as the lower stacked body ST_b and the upper stacked body ST_t of the stacked body ST_d, respectively. As described above, the stacked body ST_d differs in the planar pattern, but has the same stacked structure as the stacked body ST_chip. This is because the stacked bodies ST_d and ST_chip are formed at the same time. By forming the stacked bodies ST_d and ST_chip at the same time, the manufacturing process can be shortened.

The stacked bodies ST_chip and ST_d are initially formed as a stacked body of the first insulating film 22 (for example, a silicon oxide film) and the second insulating film 23 (for example, a silicon nitride film) in the manufacturing process. That is, the stacked bodies ST_chip and ST_d are initially composed of the same material. However, thereafter, the second insulating film 23 of the stacked body ST_chip is replaced with the conductive film 21 (for example, tungsten) that functions as a word line WL. Therefore, as the finished semiconductor wafer W, the stacked body ST_chip and the stacked body ST_d may be made of different materials. It is noted that the second insulating film 23 of the stacked body ST_d may be replaced with the conductive film 21 (for example, tungsten) in the same manner as the second insulating film 23 of the stacked body ST_chip. That is, the second material film is a tungsten film (conductive film 21). In this case, the stacked body ST_chip and the stacked body ST_d differ in the planar layout, but have the same configuration in the stacked structure and material in the Z direction.

Figure 3:
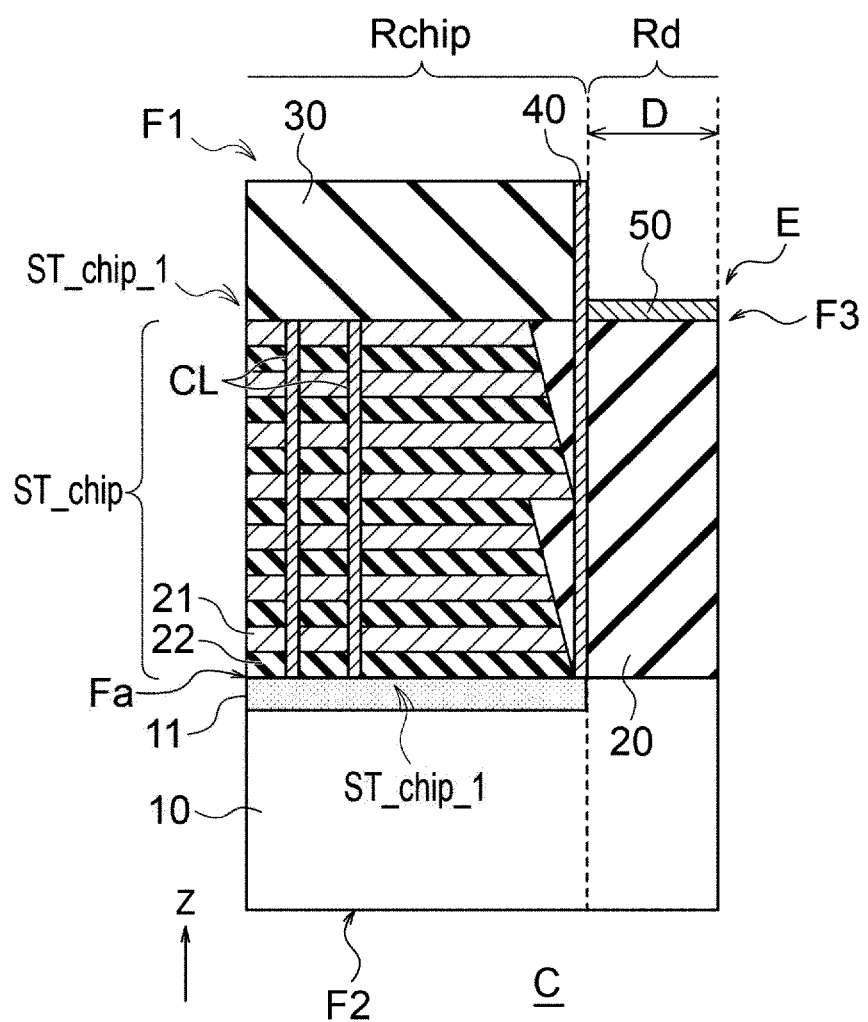
FIG. 3 is a cross-sectional view showing an example of a configuration of an end portion of a semiconductor chip according to the first embodiment.

FIG. 3 is a cross-sectional view showing an example of the configuration of the end portion of the semiconductor chip C according to the first embodiment. The semiconductor chip C (semiconductor device 100) includes the substrate 10, the control circuit 11, the stacked body ST_chip, the interlayer insulating film 20, the passivation film 30, the guard ring 40, and the metal film 50. These configurations are as described with reference to FIG. 2.

The semiconductor chip C has a first surface F1, a second surface F2 on the opposite side of the first surface F1, and a side surface F3 between the first surface F1 and the second surface F2.

Since the semiconductor chip C is cut at the dicing region Rd, the dicing region Rd as a divided region is located on an outer edge E (outer periphery) of the first surface F1. At the outer edge E, the side surface F3 has a cut surface in a dicing process. Further, the substrate 10, the interlayer insulating film 20, and the metal film 50 are exposed on the side surface F3. However, the stacked body ST_d is not exposed on the side surface F3. As will be described later, the stacked body ST_d exposed on the cut surface during blade dicing may easily become a starting point of dicing defects such as film peeling and cracks. By preventing the stacked body ST_d from being exposed on the side surface F3, poor dicing can be reduced, and fragmentation can be performed more appropriately.

Other configurations of the semiconductor chip C may be the same as the corresponding configurations of the semiconductor wafer W.

Next, the configuration of the columnar portion CL in the stacked body ST_chip will be described.

Figure 4:
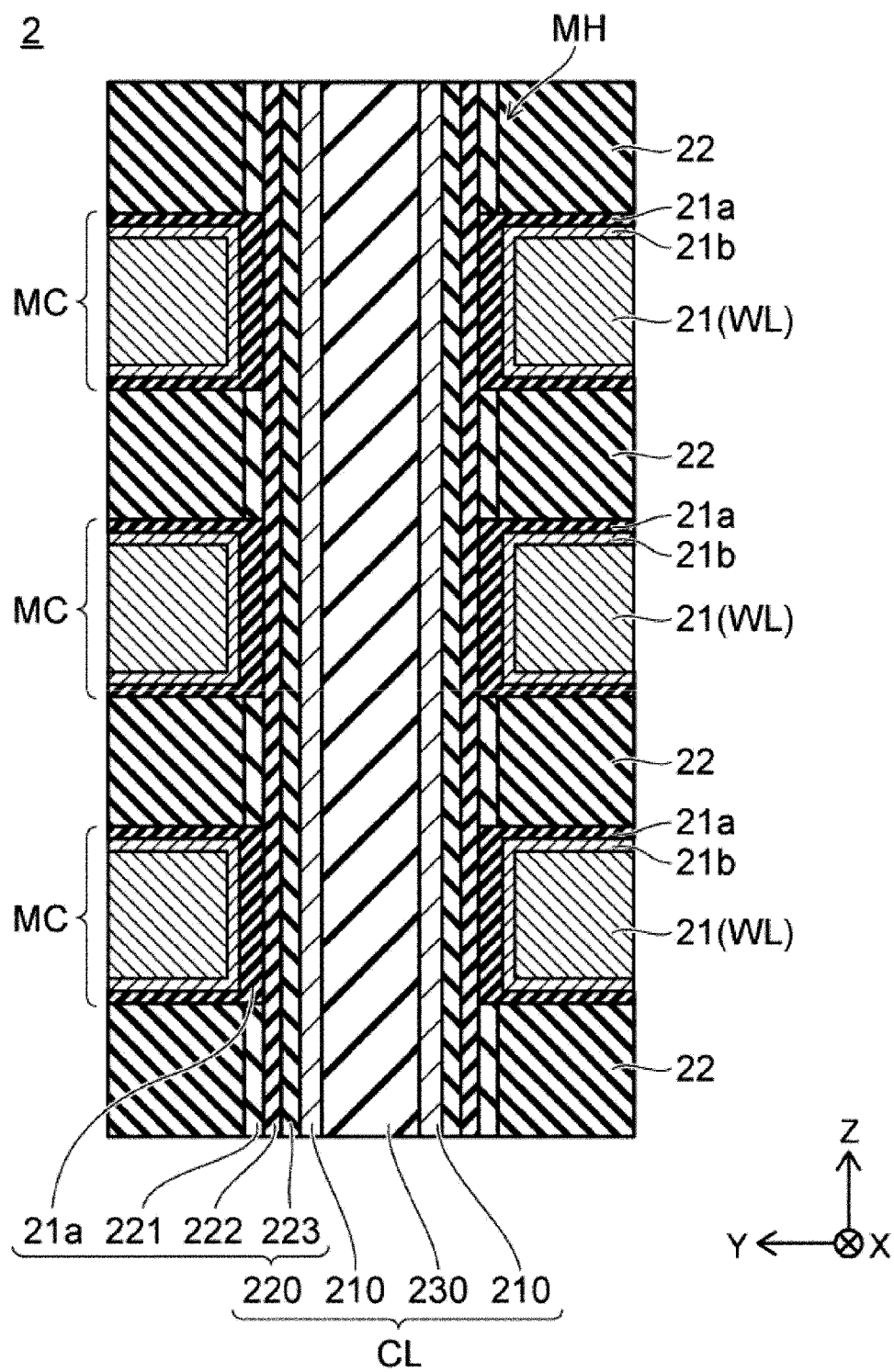
FIG. 4 is a schematic cross-sectional view showing a columnar portion.
Figure 5:
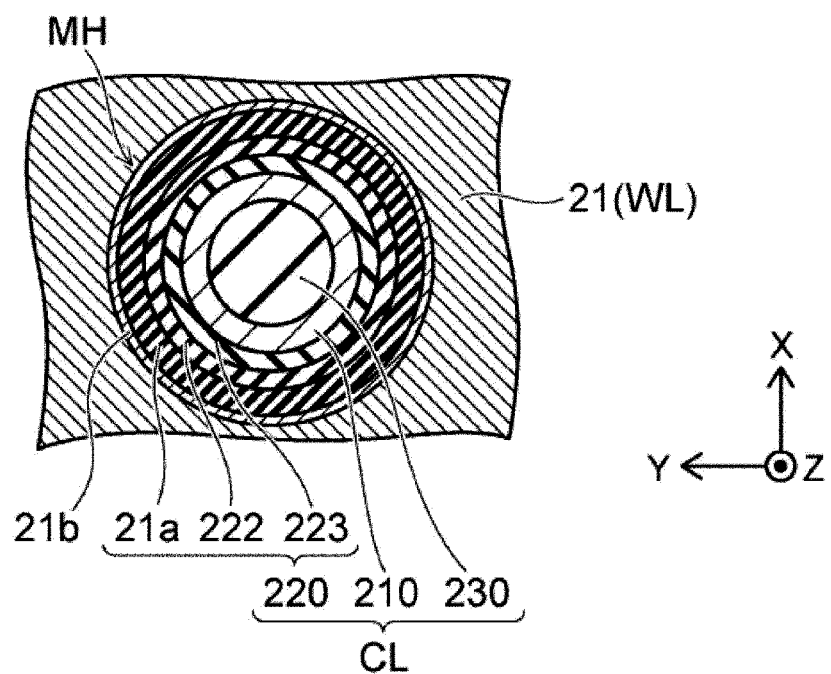
FIG. 5 is a schematic plan view showing the columnar portion.

FIG. 4 is a schematic cross-sectional view showing the columnar portion CL. FIG. 5 is a schematic plan view showing the columnar portion CL. A memory pillar MH penetrates the stacked body ST_chip from the upper end of the stacked body ST_chip along the Z-axis direction, and is provided up to the embedded source layer (a conductive film 31 in FIG. 6). A plurality of columnar portions CL include a semiconductor body 210, a memory film 220, and a core layer 230, respectively. The memory film 220 includes a charge trapping portion between the semiconductor body 210 and the conductive film 21. The plurality of columnar portions CL selected one by one from each finger are commonly connected to one bit line BL. As shown in FIG. 2, each of the columnar portions CL is provided in the chip region Rchip.

As shown in FIG. 5, the shape of the memory pillar MH in an XY plane is, for example, a circle or an ellipse. A block insulating film 21a forming a part of the memory film 220 may be provided between the conductive film 21 and the first insulating film 22. The block insulating film 21a is, for example, a silicon oxide film or a metal oxide film. One example of a metal oxide is aluminum oxide. A barrier film 21b may be provided between the conductive film 21 and the first insulating film 22 and between the conductive film 21 and the memory film 220. When the conductive film 21 is tungsten, for example, a stacked structural film of a titanium nitride and titanium is selected as the barrier film 21b. The block insulating film 21a reduces back tunneling of charges from the conductive film 21 to the memory film 220 side. The barrier film 21b improves the adhesion between the conductive film 21 and the block insulating film 21a.

The shape of the semiconductor body 210 is, for example, a cylindrical shape having a bottom. The semiconductor body 210 contains, for example, silicon. Silicon is, for example, polysilicon obtained by crystallizing amorphous silicon. The semiconductor body 210 is, for example, undoped polysilicon. The semiconductor body 210 may be p-type silicon. The semiconductor body 210 serves as a channel for each of a drain-side select transistor, a source side select transistor, and the memory cell MC.

The memory film 220 is provided with a portion other than the block insulating film 21a between the inner wall of the memory pillar MH and the semiconductor body 210. The shape of the memory film 220 is, for example, a cylindrical shape. A plurality of memory cells MC have a storage region between the semiconductor body 210 and the conductive film 21 serving as the word line WL, and are stacked in the Z-axis direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z-axis direction.

The cover insulating film 221 is provided between the insulating film 22 and the charge trapping film 222. The cover insulating film 221 contains, for example, a silicon oxide. The cover insulating film 221 protects the charge trapping film 222 from being etched when a sacrifice film (not shown) is replaced with the conductive film 21 (replacement process). The cover insulating film 221 may be removed from between the conductive film 21 and the memory film 220 in the replacement process. In this case, as shown in FIGS. 4 and 5, for example, the block insulating film 21a is provided between the conductive film 21 and the charge trapping film 222. When the replacement process is not used for forming the conductive film 21, the cover insulating film 221 may be omitted.

The charge trapping film 222 is provided between the block insulating film 21a and the cover insulating film 221 and the tunnel insulating film 223. The charge trapping film 222 contains, for example, a silicon nitride and has a trap site that traps charges in the film. The portion of the charge trapping film 222 sandwiched between the conductive film 21 serving as the word line WL and the semiconductor body 210 includes a storage region of the memory cell MC as a charge trapping portion. The threshold voltage of the memory cell MC changes depending on the presence or absence of charges in the charge trapping portion or the amount of charges trapped in the charge trapping portion. As a result, the memory cell MC can store the information.

The tunnel insulating film 223 is provided between the semiconductor body 210 and the charge trapping film 222. The tunnel insulating film 223 includes, for example, a silicon oxide, or a silicon oxide and a silicon nitride. The tunnel insulating film 223 is a potential barrier between the semiconductor body 210 and the charge trapping film 222. For example, when an electron is injected from the semiconductor body 210 into the charge trapping portion (write operation) and when a hole is injected from the semiconductor body 210 into the charge trapping portion (erasing operation), the electron and the hole each pass through (tunneling) the potential barrier of the tunnel insulating film 223.

The core layer 230 embeds the internal space of the cylindrical semiconductor body 210. The shape of the core layer 230 is, for example, a columnar shape. The core layer 230 contains, for example, a silicon oxide and is insulating.

Figure 6:
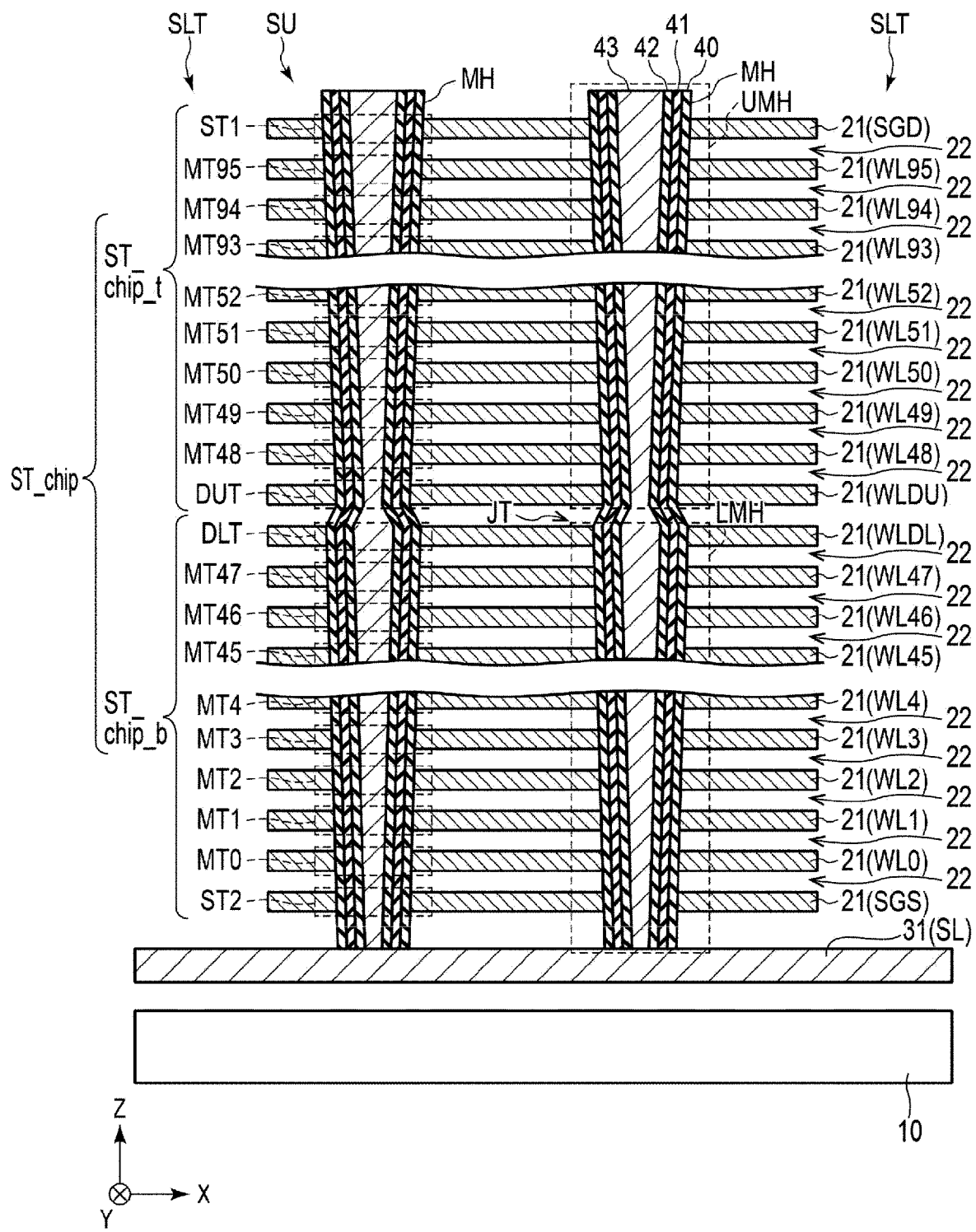
FIG. 6 is a cross-sectional view of a chip region of a semiconductor storage device according to the first embodiment.

FIG. 6 is a cross-sectional view of the chip region Rchip of the semiconductor storage device according to the first embodiment. FIG. 6 shows in more detail the structure of the memory cell array MCA in the chip region Rchip. Here, the interlayer insulating film between the conductive films is omitted. In FIG. 6, the two directions orthogonal to each other and parallel to the surface of the semiconductor substrate 10 are an X direction and a Y direction, and the direction orthogonal to the X direction and the Y direction (XY plane) are the Z direction (stacking direction). The number of layers of the word line WL of the stacked body ST_chip in FIG. 6 looks different from that in FIGS. 2 and 3, but each has the same number of layers.

The memory cell array MCA includes the semiconductor substrate 10, the conductive film 21, the interlayer insulating film (first insulating film) 22, and the memory pillar MH. The main surface of the semiconductor substrate 10 corresponds to the XY plane. A plurality of conductive films 21 are stacked on the semiconductor substrate 10 via the interlayer insulating film 22. The conductive film 21 is formed in a flat plate shape along the XY plane and functions as a source line SL. The control circuit 11 shown in FIG. 2 may be provided on the semiconductor substrate 10 and below the source line SL. However, in FIG. 6, the illustration of the control circuit 11 is omitted.

A plurality of slit SLTs along a YZ plane are located in the X direction on the conductive film 21. The structure on the conductive film 21 and between the adjacent slits SLT corresponds to, for example, one string unit SU. Specifically, the conductive film 21 and the interlayer insulating film 22 are alternately provided on the conductive film 21 and between the adjacent slit SLTs in order from the lower layer. In these conductive films 21, the conductive films adjacent to each other in the Z direction are stacked via the interlayer insulating film 22. The conductive film 21 and the interlayer insulating film 22 are each formed in a flat plate shape along the XY plane.

The lowermost layer conductive film 21 functions as a select gate line SGS. The 48 conductive films 21 on the select gate line SGS function as word lines WL0 to WL47, respectively, in order from the lower layer. The uppermost conductive film 21 of the lower stacked body ST_chip_b and the lowermost conductive film 21 of the upper stacked body ST_chip_t function as dummy word lines WLDL and WLDU, respectively. The 48 conductive films 21 on the dummy word line WLDU function as word lines WL48 to WL95 in order from the lower layer. The uppermost conductive film 21 of the upper stacked body ST_chip_t functions as a select gate line SGD.

That is, the lower stacked body ST_chip_b includes a plurality of first insulating films 22 and the plurality of conductive films 21 that are alternately stacked. The upper stacked body ST_chip_t is provided on the lower stacked body ST_chip_b and includes the plurality of first insulating films 22 and the plurality of which 41 conductive films 21 are alternately stacked.

A plurality of memory pillars MH are located in a staggered pattern in the Y direction (not shown), and each functions as one NAND string NS. Each memory pillar MH is provided through the conductive film 21 and the interlayer insulating film 22 so as to reach the upper surface of the conductive film 21 from the upper surface of the select gate wire SGD. Each memory pillar MH also includes a lower pillar LMH, an upper pillar UMH, and a joint portion JT between the lower pillar LMH and the upper pillar UMH.

The upper pillar UMH is provided on the lower pillar LMH, and the lower pillar LMH and the upper pillar UMH are joined via the joint portion JT. That is, the lower pillar LMH is provided on the conductive film 31, and the upper pillar UMH is provided on the lower pillar LMH via the joint portion JT. For example, the outer diameter of the joint portion JT has a taper from the upper end of the lower pillar LMH to the lower end of the upper pillar UMH.

That is, the lower pillar LMH penetrates the lower stacked body ST_chip_b in the Z direction. The upper pillar UMH is provided on the lower pillar LMH and penetrates the upper stacked body ST_chip_t in the Z direction.

The memory pillar MH includes, for example, the block insulating film 40, a charge storage film (also referred to as a charge storage layer) 41, a tunnel insulating film 42, and a semiconductor layer 43. Specifically, the block insulating film 40 is provided on the inner wall of the memory hole for forming the memory pillar MH. The charge storage film 41 is provided on the inner wall of the block insulating film 40. The tunnel insulating film 42 is provided on the inner wall of the charge storage film 41. Further, the semiconductor layer 43 is provided in the tunnel insulating film 42. The memory pillar MH may have a structure in which a core insulating film is provided in the semiconductor layer 43.

In such a configuration of the memory pillar MH, the portion where the memory pillar MH and the select gate line SGS intersect functions as a select gate transistor ST2. The portions where the memory pillar MH and the word lines WL0 to WL47 intersect function as memory cell transistors MT0 to MT47, respectively. Each memory cell transistor MT0 to MT47 is a memory cell in which data is stored or can be stored. The portions where the memory pillar MH and the dummy word lines WLDL and WLDU intersect function as dummy transistors DLT and DUT, respectively. Each of the dummy transistors DLT and DUT is a memory cell in which data is not stored. The portions where the memory pillar MH and the word lines WL48 to WL95 intersect function as memory cell transistors MT48 to MT95, respectively. Each of the memory cell transistors MT48 to MT95 is a memory cell in which data is stored or can be stored. Further, the portion where the memory pillar MH and the select gate line SGD intersect functions as a select gate transistor ST1.

The semiconductor layer 43 functions as a channel layer of the memory cell transistor MT, the dummy transistors DLT and DUT, and the select gate transistors ST1 and ST2. A current path of the NAND string NS is formed in the semiconductor layer 43.

The charge storage film 41 has a function of storing the charges injected from the semiconductor layer 43 in the memory cell transistor MT. The charge storage film 41 includes, for example, a silicon nitride film.

The tunnel insulating film 42 functions as a potential barrier when charges are injected from the semiconductor layer 43 into the charge storage film 41 or when the charges stored in the charge storage film 41 diffuse into the semiconductor layer 43. The tunnel insulating film 42 includes, for example, a silicon oxide film.

The block insulating film 40 prevents the charges stored in the charge storage film 41 from diffusing into the word lines WL0 to WL95. The block insulating film 40 includes, for example, a silicon oxide film and a silicon nitride film.

The configuration of the memory cell array MCA is not limited to the above configuration. For example, the numbers of the memory cell transistors MT, the dummy transistors DLT and DUT, and the select gate transistors ST1 and ST2 provided in each NAND string NS may be any numbers, respectively.

The numbers of the word lines WL, the dummy word lines WLDL and WLDU, and the select gate lines SGD and SGS are changed according to the numbers of the memory cell transistors MT, the dummy transistors DLT and DUT, and the select gate transistors ST1 and ST2, respectively. The select gate line SGS may be composed of a plurality of conductive films provided on each of a plurality of layers. The select gate line SGD may be composed of a plurality of conductive films provided on each of the plurality of layers.

Other configurations of the memory cell array MCA are described in, for example, "Three-dimensional Stacked Nonvolatile Semiconductor Memory", U.S. patent application Ser. No. 12/407,403 filed on Mar. 19, 2009. The configurations are described in "Three-dimensional stacked nonvolatile semiconductor memory", U.S. patent application Ser. No. 12/406,524 filed on Mar. 18, 2009, "Nonvolatile Semiconductor Storage Device and Method for Manufacturing the Same", U.S. patent application Ser. No. 12/679,991 filed on Mar. 25, 2010, and "Semiconductor Memory and Method for Manufacturing the Same", U.S. patent application Ser. No. 12/532,030 filed on Mar. 23, 2009, respectively. These patent applications are incorporated herein by reference in the entirety thereof.

Next, a method for manufacturing a semiconductor wafer according to the present embodiment will be described.

FIGS. 7 to 12 are cross-sectional views showing an example of a method for manufacturing the semiconductor wafer W according to the first embodiment. First, the control circuit 11 is formed on the surface Fa of the substrate 10. The control circuit 11 is, for example, a CMOS circuit composed of a transistor or the like. The control circuit 11 is covered with an interlayer insulating film (not shown). The interlayer insulating film is flattened.

Figure 7:
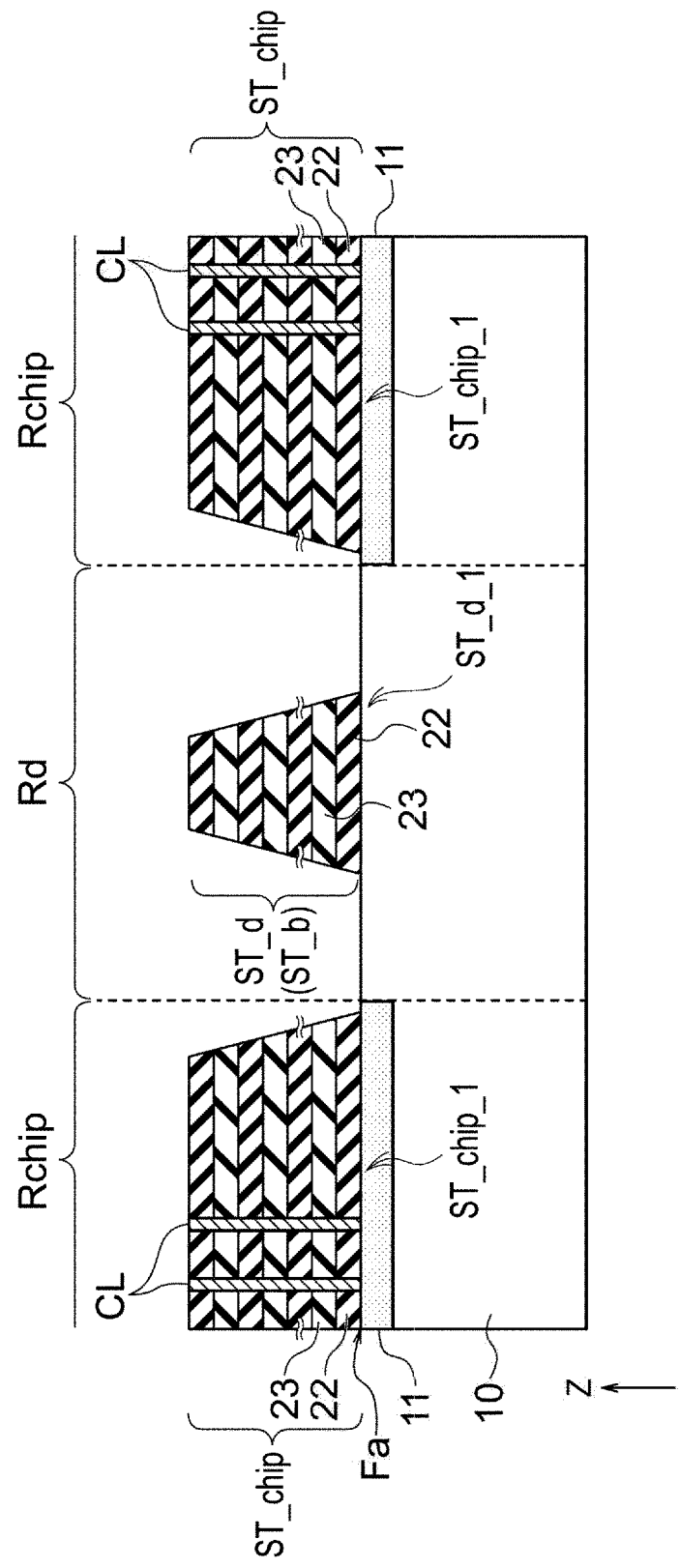
FIG. 7 is a cross-sectional view showing an example of a method for manufacturing the semiconductor wafer according to the first embodiment.

Next, the first insulating film 22 and the second insulating film 23 are alternately stacked above the control circuit 11. For example, a silicon oxide is used for the first insulating film 22. For example, a silicon nitride is used for the second insulating film 23. As a result, as shown in FIG. 7, the lower portion of the stacked body ST_chip is formed in the chip region Rchip, and the lower stacked body ST_b is formed in the dicing region Rd. Here, as the numbers of the first insulating films 22 and the second insulating films 23 provided in the stacked body ST_chip increase, the aspect ratio of the memory hole increases. Therefore, the memory hole and the columnar portion CL are formed a plurality of times in the lower portion and the upper portion of the stacked body ST_chip. Since the stacked body ST_d is formed at the same time as the stacked body ST_chip, the stacked body ST_d is also formed a plurality of times in the lower stacked body ST_b and the upper stacked body ST_t. In FIG. 7, a memory hole is formed in the lower portion of the stacked body ST_chip, and the lower portion of the columnar portion CL is formed.

Next, a memory hole is formed in order to form the columnar portion CL in the stacked body ST_chip by using the lithography technique and the etching technique. At the time of forming the memory hole or thereafter, by using the lithography technique and the etching technique, the first insulating film 22 and the second insulating film 23 between the stacked body ST_d and the stacked body ST_chip are removed to separate the stacked body ST_d and the stacked body ST_chip. As a result, the structure shown in FIG. 7 is obtained.

That is, in the process shown in FIG. 7, the lower stacked body ST_b (first lower stacked body) having a plurality of first insulating films 22 and a plurality of second insulating films 23 that are alternately stacked is formed in the dicing region Rd, and the lower stacked body ST_chip_b (second lower stacked body) having a plurality of first insulating films 22 and a plurality of second insulating films 23 that are alternately stacked is formed in the chip region Rchip. The lower pillar LMH (lower columnar portion) that penetrates the lower stacked body ST_chip_b in the Z direction is formed.

Figure 8:
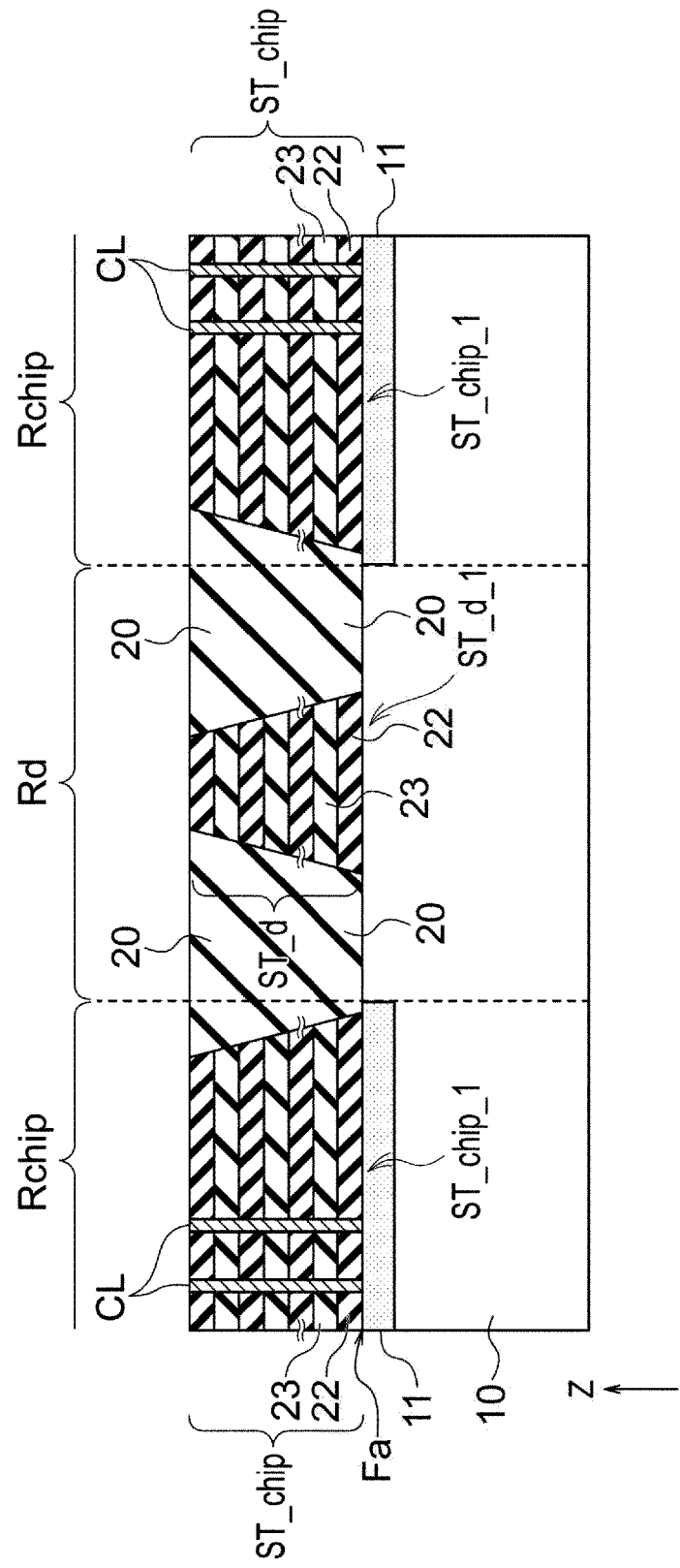
FIG. 8 is a cross-sectional view showing an example of a method for manufacturing the semiconductor wafer, following FIG. 7.

Next, the interlayer insulating film 20 is deposited on the stacked body ST_d and the stacked body ST_chip. For the interlayer insulating film 20, for example, an insulating film such as a TEOS film is used. Next, the interlayer insulating film 20 is flattened until the upper surfaces of the stacked body ST_d and the stacked body ST_chip are exposed. The interlayer insulating film 20 is left in the groove between the stacked body ST_d and the stacked body ST_chip. As a result, the structure shown in FIG. 8 is obtained.

Next, the first insulating film 22 and the second insulating film 23 are alternately stacked on the lower portion of the stacked body ST_chip and the stacked body ST_d. As a result, as shown in FIG. 9, the upper portion of the stacked body ST_chip is formed in the chip region Rchip, and the upper stacked body ST_t is formed in the dicing region Rd.

Next, a memory hole is formed in order to form the columnar portion CL on the upper portion of the stacked body ST_chip by using the lithography technique and the etching technique. Further, the upper portion of the columnar portion CL is formed in the memory hole.

At the time of forming the memory hole or thereafter, by using the lithography technique and the etching technique, the first insulating film 22 and the second insulating film 23 between the upper portion of the stacked body ST_d and the upper portion of the stacked body ST_chip are removed to separate the stacked body ST_d and the stacked body ST_chip. As a result, the structure shown in FIG. 9 is obtained.

Figure 9:
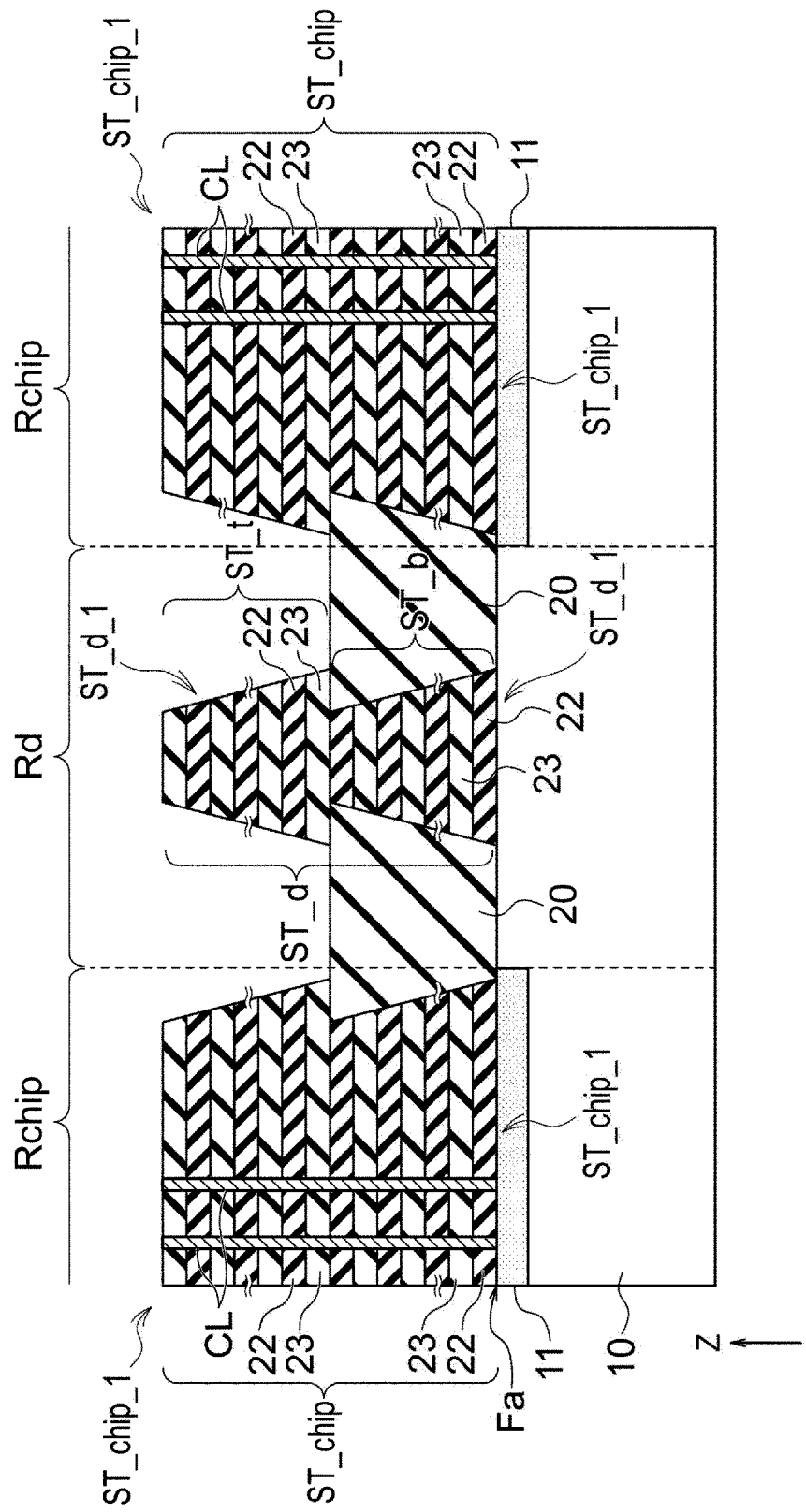
FIG. 9 is a cross-sectional view showing an example of a method for manufacturing the semiconductor wafer, following FIG. 8.

That is, in the process shown in FIG. 9, the upper stacked body ST_t (first upper stacked body) having a plurality of first insulating films 22 and a plurality of second insulating films 23 that are alternately stacked is formed on the lower stacked body ST_b, and the upper stacked body ST_chip_t (second upper stacked body) having a plurality of first insulating films 22 and a plurality of second insulating films 23 that are lower stacked body alternately stacked is formed on the ST_chip_b. Further, the upper pillar UMH (upper columnar portion) that penetrates the upper stacked body ST_chip_t in the Z direction is formed on the lower pillar LMH.

In the process shown in FIGS. 7 to 9, the first stacked body ST_d_1 having a plurality of first material films (first insulating film 22) and a plurality of second material films (second insulating film 23) that are alternately stacked is formed in the dicing region Rd of the semiconductor wafer W a plurality of times in the normal line direction (Z direction) of the substrate surface (surface Fa) of the semiconductor wafer W.

Figure 10:
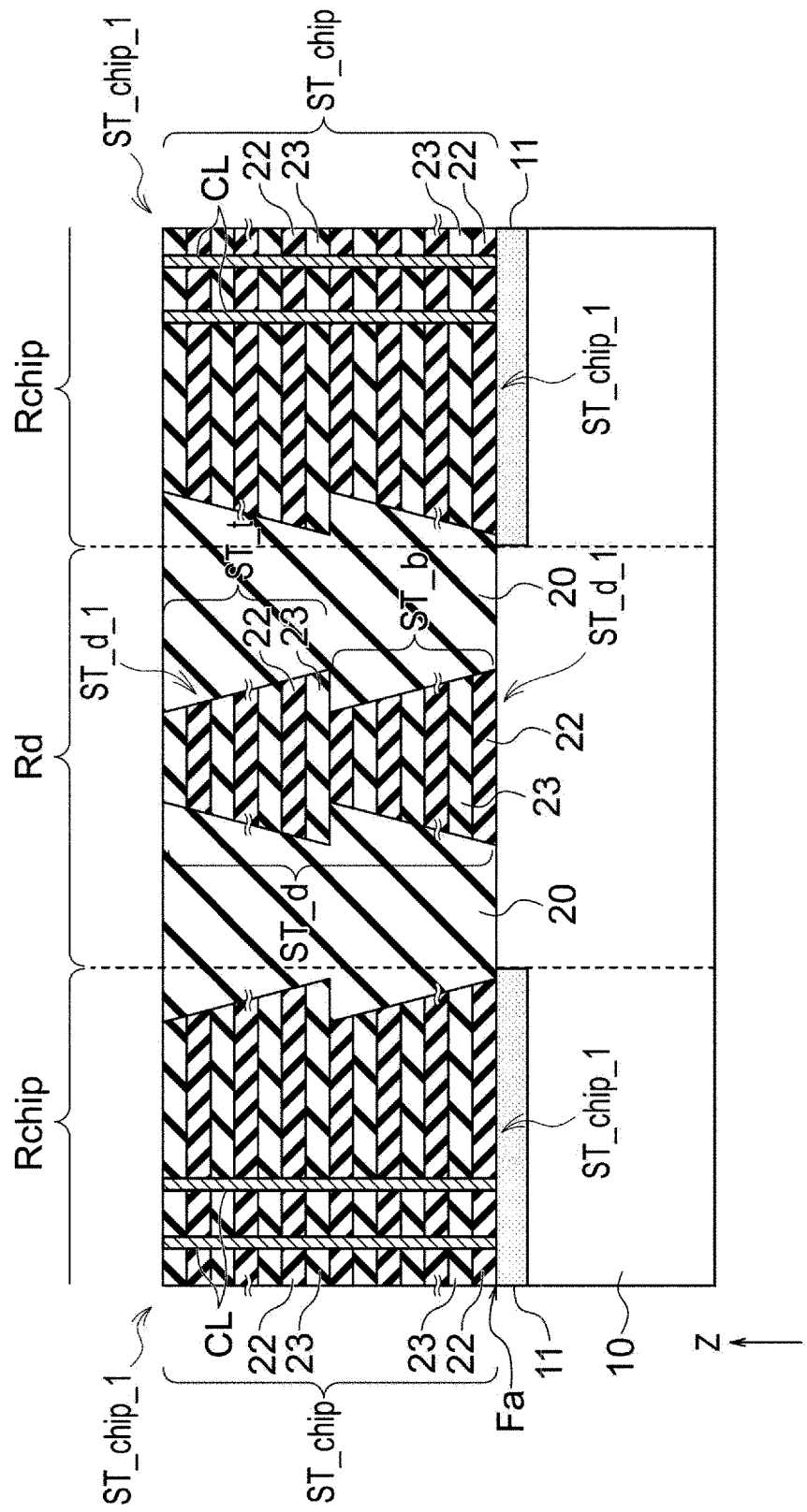
FIG. 10 is a cross-sectional view showing an example of a method for manufacturing the semiconductor wafer, following FIG. 9.

Next, the interlayer insulating film 20 is deposited on the stacked body ST_d and the stacked body ST_chip. Next, the interlayer insulating film 20 is flattened until the upper surfaces of the stacked body ST_d and the stacked body ST_chip are exposed. The interlayer insulating film 20 is left in the groove between the stacked body ST_d and the stacked body ST_chip. As a result, the structure shown in FIG. 10 is obtained.

That is, in the process shown in FIGS. 7 to 10, the first stacked body ST_d_1 is formed in the dicing region Rd, the second stacked body ST_chip_1 having a plurality of first insulating films and a plurality of second insulating films 23 that are alternately stacked in the chip region Rchip is formed, and the interlayer insulating film 20 (insulating film) between the first stacked body ST_d_1 and the second stacked body ST_chip_1 is formed a plurality of times in the Z direction.

Figure 11:
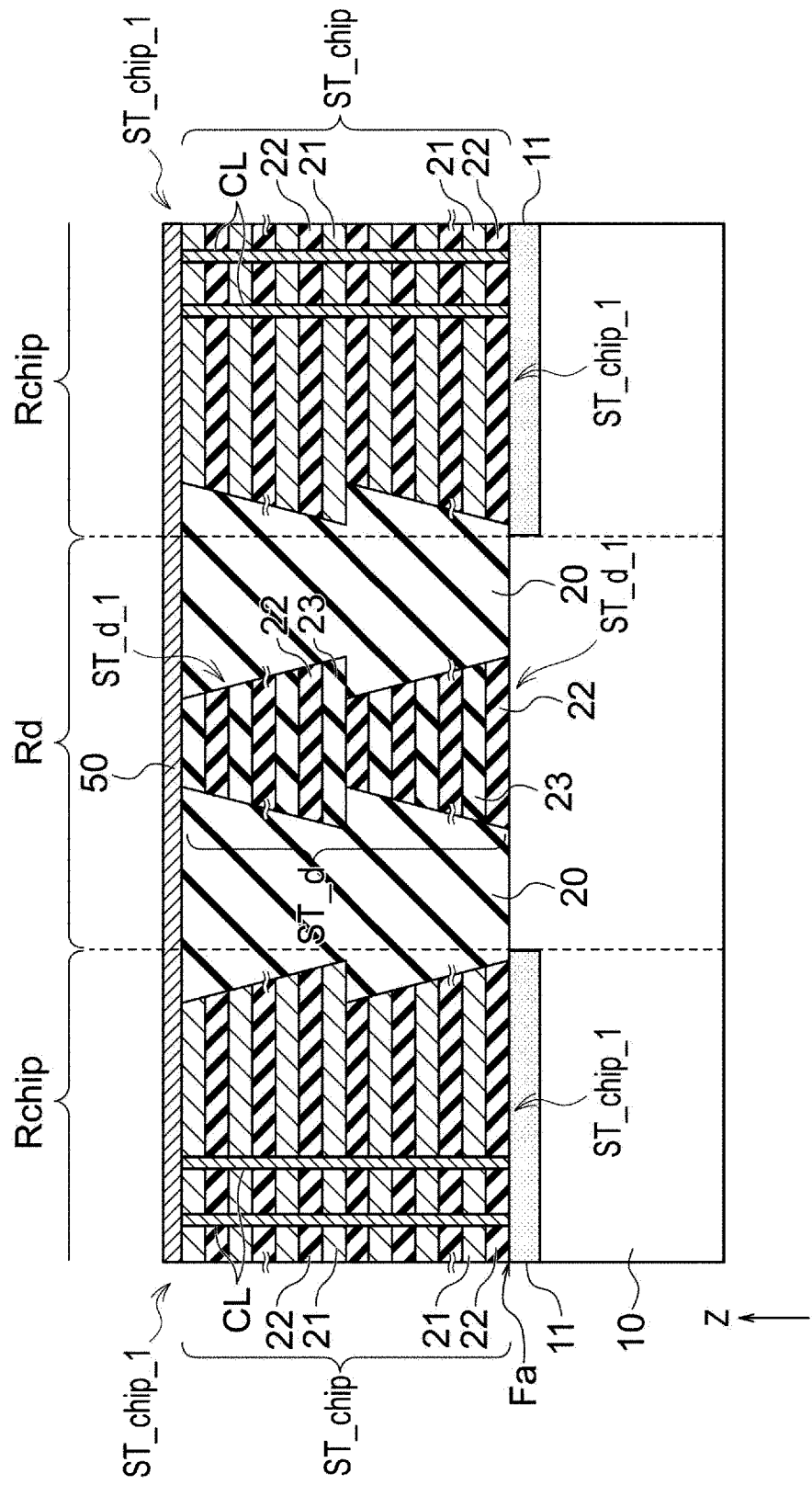
FIG. 11 is a cross-sectional view showing an example of a method for manufacturing the semiconductor wafer, following FIG. 10.

Next, a slit (not shown) is formed, and as shown in FIG. 11, the second insulating film 23 is replaced with the conductive film 21 via the slit. For the conductive film 21, for example, a conductive metal such as tungsten is used. The conductive film 21 functions as the word line WL. Next, the metal film 50 is deposited on the stacked body ST_d and the stacked body ST_chip. For the metal film 50, for example, a metal such as aluminum is used. The metal film 50 functions as an alignment mark or a pad. The alignment mark is used for alignment in a lithography process or the like. The pads are wire-bonded in the assembly process and are used for electrical connection to the outside of the semiconductor package.

That is, in the process shown in FIG. 11, the second insulating film 23 of the lower stacked body ST_chip_b and the upper stacked body ST_chip_t is replaced with the conductive film 21.

Next, by using the lithography technique and the etching technique, the metal film 50 is processed to remove the metal film 50 in the chip region Rchip, and the metal film 50 is left in the dicing region Rd. At this time, the conductive film 21 of the stacked body ST_chip is also left.

Figure 12:
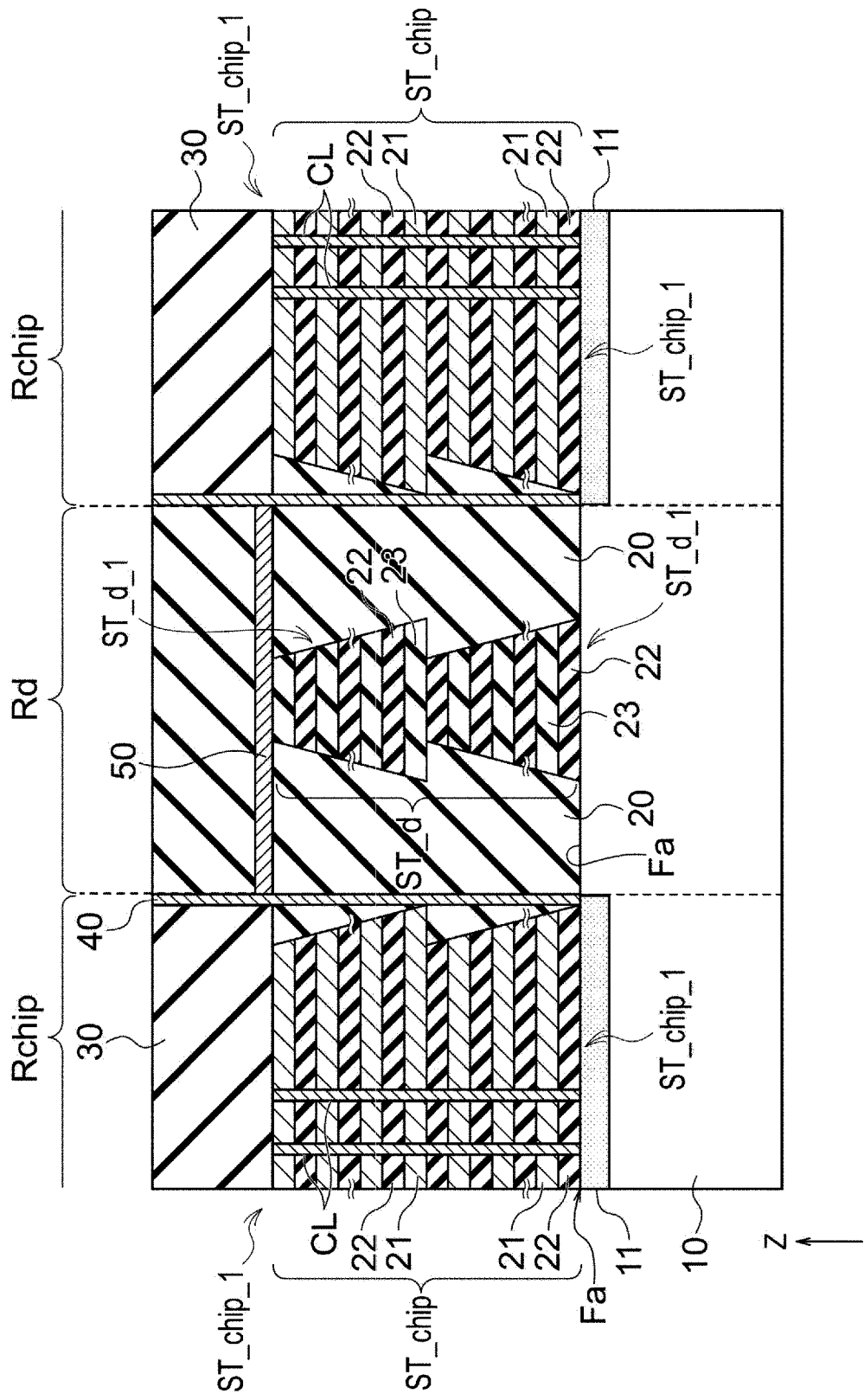
FIG. 12 is a cross-sectional view showing an example of a method for manufacturing the semiconductor wafer, following FIG. 11.

Next, as shown in FIG. 12, the passivation film 30 is formed on the stacked bodies ST_chip and ST_d. For the passivation film 30, for example, an insulating film such as polyimide is used. Next, the guard ring 40 is formed between the chip region Rchip and the dicing region Rd. For the guard ring 40, for example, a single layer of a metal material such as tungsten, copper, aluminum, titanium, and tantalum, or a stacked layer of a plurality of these materials is used.

Next, the passivation film 30 in the dicing region Rd is removed. As a result, the semiconductor wafer W shown in FIG. 2 is obtained.

As shown in FIGS. 7 and 9, the columnar portion CL is formed a plurality of times. As a result, as shown in FIG. 6, the width of the columnar portion CL changes in a complicated manner from the upper end to the lower end of the columnar portion CL. The width of the columnar portion CL decreases from the upper end to the lower end of the upper stacked body ST_chip_t. The width of the columnar portion CL increases from the lower end of the upper stacked body ST_chip_t to the upper end of the lower stacked body ST_chip_b at the joint portion JT. The width of the columnar portion CL decreases from the upper end of the lower stacked body ST_chip_b to the lower end of the lower stacked body ST_chip_b.

The width of each of the upper pillar UMH and the lower pillar LMH decreases from the upper side of the paper surface to the lower side of the paper surface in FIG. 6. That is, the widths of the lower pillar LMH and the upper pillar UMH decrease from the upper end to the lower end. The width of the upper end of the lower pillar LMH is larger than the width of the lower end of the upper pillar UMH. The width of the joint portion JT is provided so that, for example, the wide upper end of the lower pillar LMH and the narrow lower end of the upper pillar UMH can be connected.

As the second material film of the stacked bodies ST_chip and ST_d, a phosphorus (P)-doped polysilicon film may be formed instead of the second insulating film 23. In this case, the replacement of the second insulating film 23 with the conductive film 21 does not have to be performed.

In the process shown in FIG. 11, a part of the second insulating film 23 of the stacked body ST_d may be replaced with the conductive film 21. That is, at least a part of the second insulating film 23 of the lower stacked body ST_b and the upper stacked body ST_t, and the second insulating film 23 of the lower stacked body ST_chip_b and the upper stacked body ST_chip_t may be replaced with the conductive film 21.

Next, the dicing process will be described. More specifically, the details of blade dicing will be described.

As shown in FIG. 1, for example, when the blade BLD cuts the dicing region Rd on the four sides of the outer periphery of the chip region Rchip, the semiconductor wafer W is fragmented into the semiconductor chip C.

In the blade dicing shown in FIG. 2, if the stacked body ST_d remains on the cut surface, the stacked body ST_d may easily become a starting point of dicing defects such as film peeling and cracks.

Therefore, the semiconductor wafer W is fragmented by the blade BLD having a width Wb wider than a width Wd of the first stacked body ST_d_1 (stacked body ST_d). By preventing the stacked body ST_d from appearing on the cut surface, dicing defects such as film peeling and cracks can be reduced, and the semiconductor wafer W can be more appropriately fragmented. The width Wb of the blade BLD is, for example, about 60 µm or more. The width Wd of the stacked body ST_d is, for example, about 30 µm or more.

More specifically, the semiconductor wafer W is fragmented by the blade BLD having the width Wb wider than the width Wd of the lower stacked body ST_b and the upper stacked body ST_t.

More specifically, the semiconductor wafer is fragmented by the blade BLD passing through the dicing region Rd so that the width Wb of the blade BLD covers the width Wd of the first stacked body ST_d_1 (stacked body ST_d). As a result, the entire stacked body ST_d is cut off from the semiconductor wafer W by passing the blade BLD once. As a result, the semiconductor wafer W is fragmented so that the stacked body ST_d does not remain.

It is more preferable to fragment the semiconductor wafer W by the blade BLD having the width Wb wider than the width Wd of the stacked body ST_d so that the area where side surfaces BLDs of the blade BLD are in contact with the interlayer insulating film 20 is large. That is, the dicing position is adjusted so that the area of the interlayer insulating film 20 exposed on the cut surface becomes large and the stacked body ST_d does not appear on the cut surface. This is because the stacked body ST_d in contact with the side surfaces BLDs of the blade BLD may easily become a starting point of dicing defects such as film peeling and cracks.

Next, the details of the configuration of the end portion of the semiconductor chip C will be described. Although FIG. 3 shows the end portion of one side of the semiconductor chip C, the configuration of the end portions of the other three sides is almost the same as that of FIG. 3.

The semiconductor element which is the stacked body ST_chip includes the plurality of stages of second stacked bodies ST_chip_1 having the plurality of first insulating films 22 and the plurality of conductive films 21 which are alternately stacked in the normal line direction. The semiconductor element is provided on the semiconductor substrate 10. As shown in FIG. 1, the semiconductor elements are disposed in the center of the semiconductor chip C when viewed from the Z direction.

As shown in FIG. 3, the interlayer insulating film 20 is provided on the semiconductor substrate 10. The interlayer insulating film 20 is exposed to the side surface F3 with a thickness of a first predetermined value or more in the Z direction along the outer edge E of the semiconductor chip C when viewed from the Z direction. The interlayer insulating film 20 appears uniformly along the outer edge E, for example, on the side surface F3. The first predetermined value is, for example, about 4.5 µm. The first predetermined value is determined by, for example, the thickness of the stacked body ST_chip which is the memory cell array MCA or the number of stacked layers. The thickness of the stacked body ST_chip is, for example, about 3 µm or more. The first predetermined value is, for example, a predetermined ratio (for example, 40%) of the thickness of the interlayer insulating film 20 to the thickness from the surface Fa of the semiconductor substrate 10 or the bottom surface of the control circuit 11 to the first surface F1. This is because the semiconductor substrate 10, the control circuit 11, the metal film 50, and the like may also be exposed on the side surface F3.

The stacked body ST_d hardly appears on the side surface F3 which is a cut surface. Almost only the interlayer insulating film 20 is exposed on the side surface F3 between the semiconductor substrate 10 and the metal film 50. That is, the stacked body having the plurality of first insulating films 22 and the plurality of second material films which are alternately stacked is not exposed on the side surface F3. The second material film is, for example, a silicon nitride film, a tungsten (W) film, or a phosphorus (P)-doped polysilicon film.

Even when the blade BLD having a large width Wb is used, it is necessary not to cut the semiconductor element. Therefore, the dicing position is set so that the interlayer insulating film 20 remains between the side surface F3 and the semiconductor element (guard ring 40). The interlayer insulating film 20 is provided with a width of a second predetermined value or more from the side surface F3 along the outer edge E toward the stacked body ST_chip which is a semiconductor element. The second predetermined value is, for example, about 3 µm. In the example shown in FIG. 3, a distance D between the guard ring 40 and the side surface F3 is, for example, about 3 µm or more. The second predetermined value is determined by, for example, the processing tolerance according to the device position (dicing position) accuracy, the blade thickness accuracy, and the like.

The side surface F3 has a predetermined surface roughness. Due to blade dicing, the entire surface of the side surface F3, which is the cut surface, is roughened. Therefore, the side surface F3 according to the first embodiment is different from the cut surface by laser dicing such as laser ablation or stealth dicing (registered trademark), for example. The surface roughness of the side surface F3 is determined by the count (side surface roughness) of the blade BLD. The count of the blade BLD is, for example, #5000 or less.

As described above, in the first embodiment, the semiconductor wafer W is fragmented by the blade BLD having the width Wb wider than the width of the stacked body ST_d. As a result, the semiconductor wafer W can be fragmented so that the stacked body ST_d is not exposed on the side surface F3 along the outer edge E. As a result, dicing defects such as film peeling and cracks can be reduced, and fragmentation can be performed more appropriately.

Next, as a modification example, a case where blade dicing is performed by using a thin blade BLD will be described.

Figure 13:
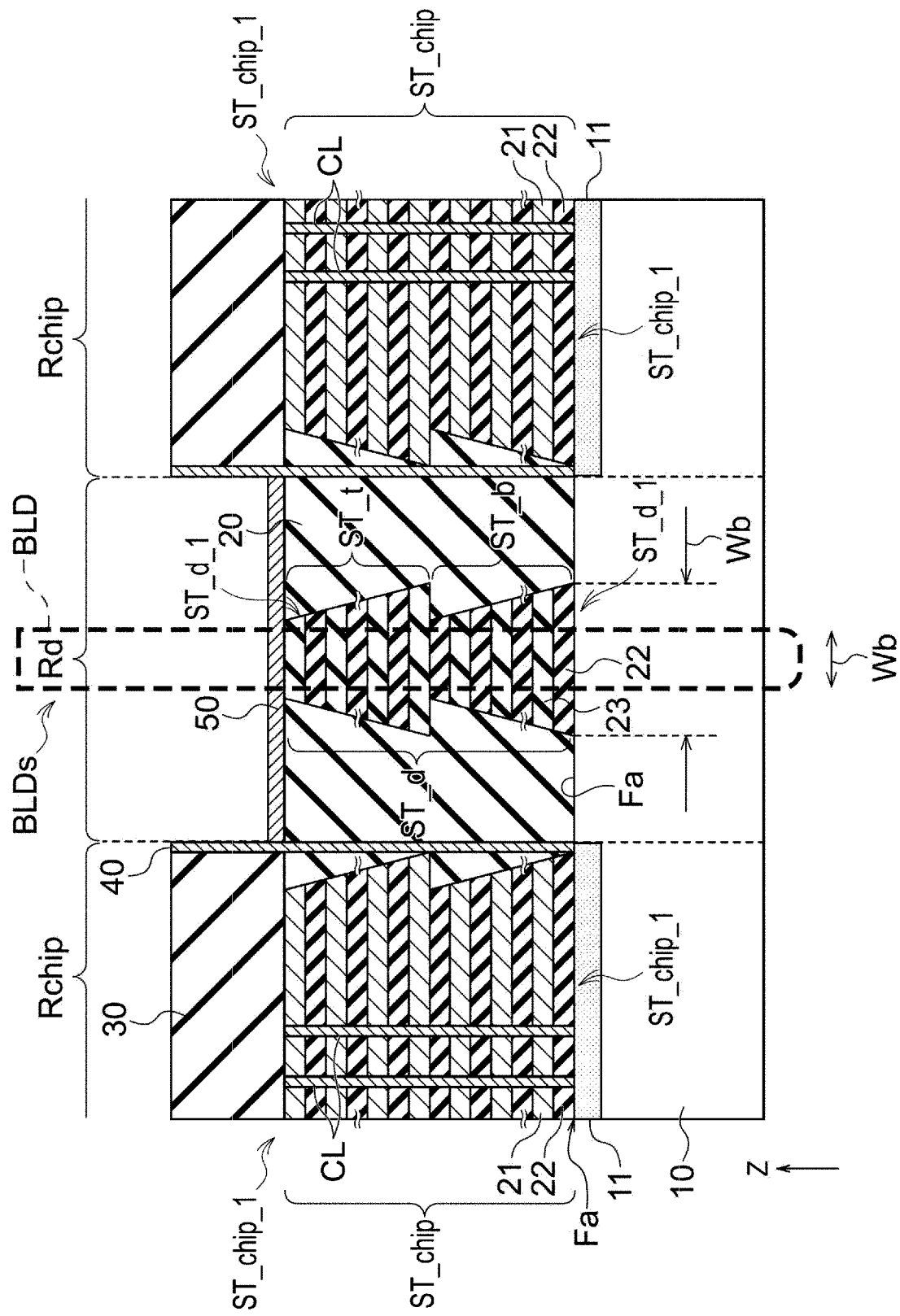
FIG. 13 is a cross-sectional view showing an example of a configuration of a semiconductor wafer according to a comparative example.

FIG. 13 is a cross-sectional view showing an example of the configuration of the semiconductor wafer W according to a comparative example. In the comparative example, the width Wb of the blade BLD is, for example, about 20 µm to about 40 µm.

In the example shown in FIG. 13, the width Wb of the blade BLD is covered with the width Wd of the stacked body ST_d. That is, blade dicing is performed by the blade BLD passing through the inside of the stacked body ST_d. In this case, the stacked body ST_d is exposed on the cut surface.

Figure 14:
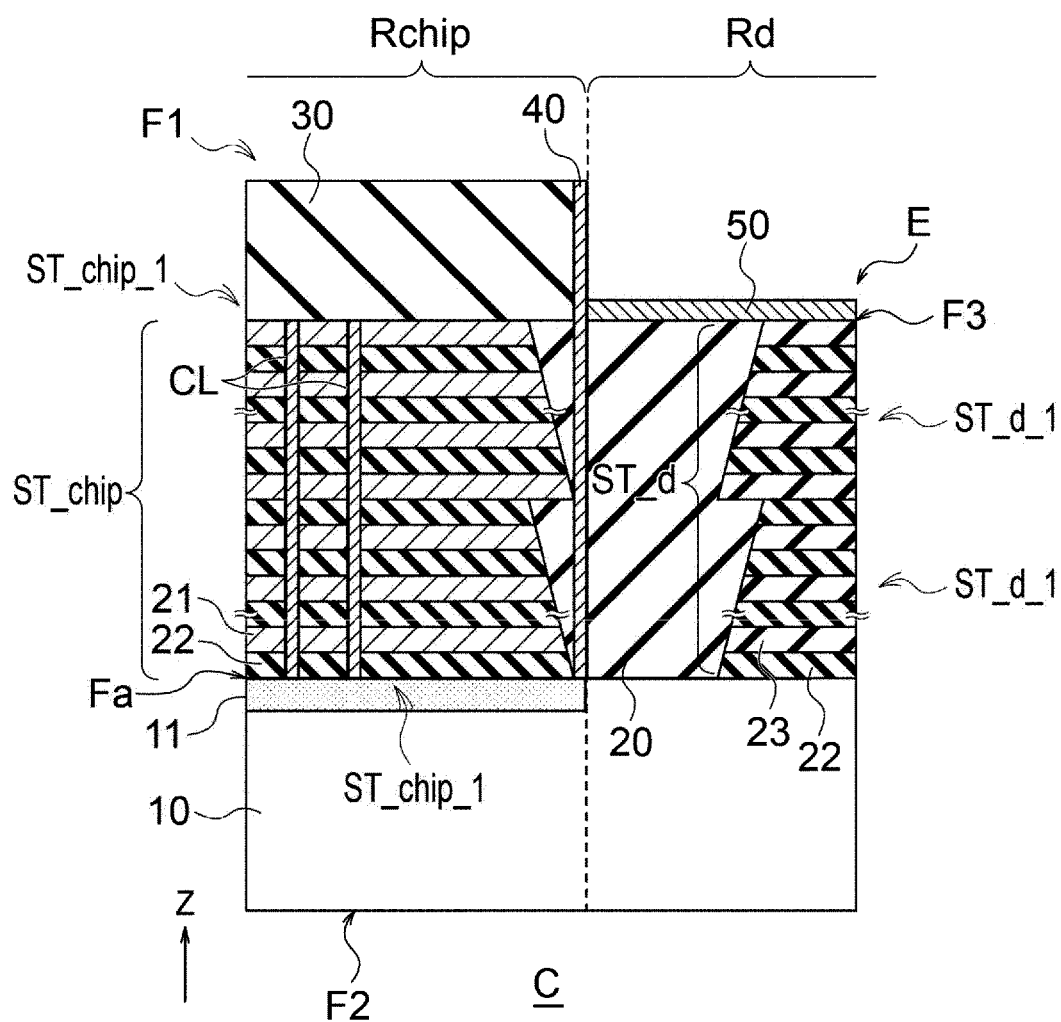
FIG. 14 is a cross-sectional view showing an example of a configuration of an end portion of the semiconductor chip according to the comparative example.

FIG. 14 is a cross-sectional view showing an example of the configuration of the end portion of the semiconductor chip C according to the comparative example.

In the example shown in FIG. 14, the stacked body ST_d is exposed on the side surface F3. Depending on the position along the outer edge E of the semiconductor chip C, the interlayer insulating film 20 may be exposed without exposing the stacked body ST_d, either the upper stacked body ST_t or the lower stacked body ST_b may be exposed, and the stacked body ST_d in which a part of the second insulating film 23 is replaced with the conductive film 21 may be exposed. If blade dicing is performed so that the above-mentioned stacked body ST_d is exposed on the cut surface in this way, dicing defects such as film peeling and cracks may occur starting from the stacked body ST_d. This film peeling, cracks, and the like may develop into the stacked body ST_chip, which is the memory cell array MCA.

On the other hand, in the first embodiment, the entire stacked body ST_d is cut out at once by the blade BLD. As a result, film peeling and cracks starting from the stacked body ST_d can be reduced. As a result, fragmentation can be performed more appropriately.

As the numbers of stacked layers ST_chip and ST_d increase, the number of places where film peeling and cracks occur may increase. Normally, it is preferable that the number of stacked layers is large in order to increase the density and capacity of the memory. However, as the number of layers increases, the aspect ratio of the memory hole increases as described above, and the number of damage starting points increases, which may lead to dicing defects such as film peeling. In order to reduce the aspect ratio of the memory hole, the stacked bodies ST_chip and ST_d may be formed a plurality of times as described above. Even when the number of stages of the second stacked body ST_cip_1 is large, if the total number of stacked bodies is the same, the susceptibility to dicing defects such as film peeling is almost the same. Therefore, as the number of stages of the stacked body is larger, it is more preferable to use a thick blade BLD as in the first embodiment.

When the stacked bodies ST_chip and ST_d are formed a plurality of times, the columnar portion CL is formed a plurality of times. The columnar portion CL (memory pillar MH) may have the shape of the joint portion JT and the surroundings thereof, as shown in FIG. 6.

In the first embodiment, the stacked body ST_chip includes the two-stage second stacked body ST_chip_1 in the Z direction, and the stacked body ST_d includes the two-stage first stacked body ST_d_1 in the Z direction. However, the stacked body ST_chip may have a three or more stages of a second stacked body ST_chip_1 in the Z direction, and the stacked body ST_d may have a three or more stages of first stacked bodies ST_d_1 in the Z direction. In this case, the upper stacked body and the lower stacked body indicate a continuous two-stage stacked body among the three or more stages of stacked bodies.

Second Embodiment

Figure 15:
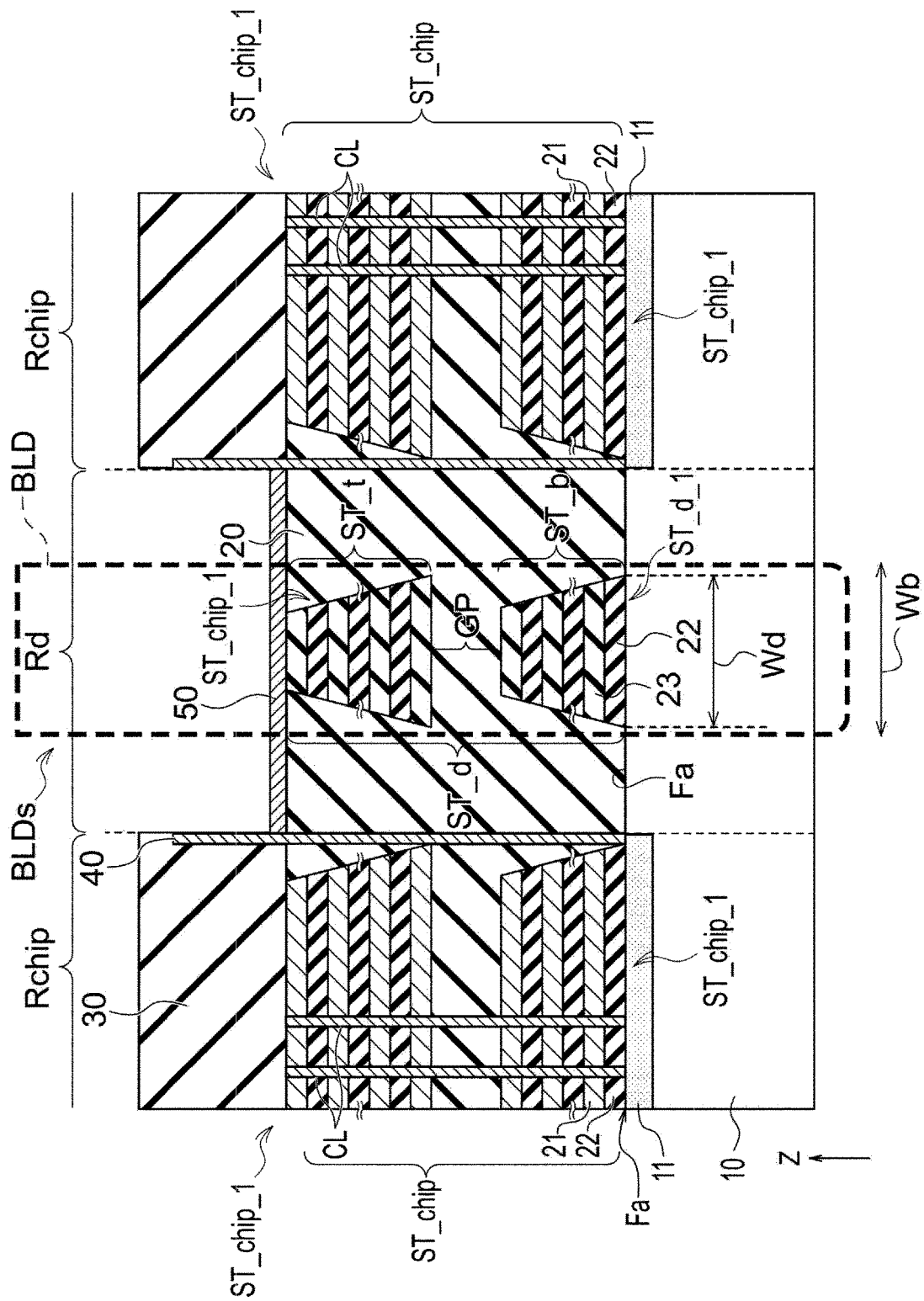
FIG. 15 is a cross-sectional view showing an example of a configuration of a semiconductor wafer according to a second embodiment.

FIG. 15 is a cross-sectional view showing an example of the configuration of the semiconductor wafer W according to a second embodiment. The second embodiment is different from the first embodiment in that a gap GP is provided between the lower stacked body ST_b and the upper stacked body ST_t.

The stacked body ST_d is stacked in the same manner as the stacked body ST_chip of the chip region Rchip. That is, in the dicing region Rd, the interlayer insulating film (first insulating film) 22 and the second insulating film 23 are alternately provided above the substrate 10. In the chip region Rchip, since the second insulating film 23 is replaced with the conductive film 21, the second insulating film 23 is not provided, but in the dicing region Rd, the second insulating film 23 is left on the same layer as the conductive film 21.

The gap GP corresponding to the joint portion JT of the chip region Rchip is provided between the lower stacked body ST_b and the upper stacked body ST_t. The width (thickness) of the gap GP in the Z direction is larger (thick) than the distance (thickness of the interlayer insulating film 22) between the second insulating films 23 in the lower stacked body ST_b and the upper stacked body ST_t. The gap GP is provided with the same material as the interlayer insulating film 22.

The side surface of the stacked body ST_d has a taper similar to the taper of the end side surface of the stacked body ST_chip. This is because the stacked bodies ST_d and ST_chip are stacked in the same stacking process and processed in the same etching process.

Figure 16:
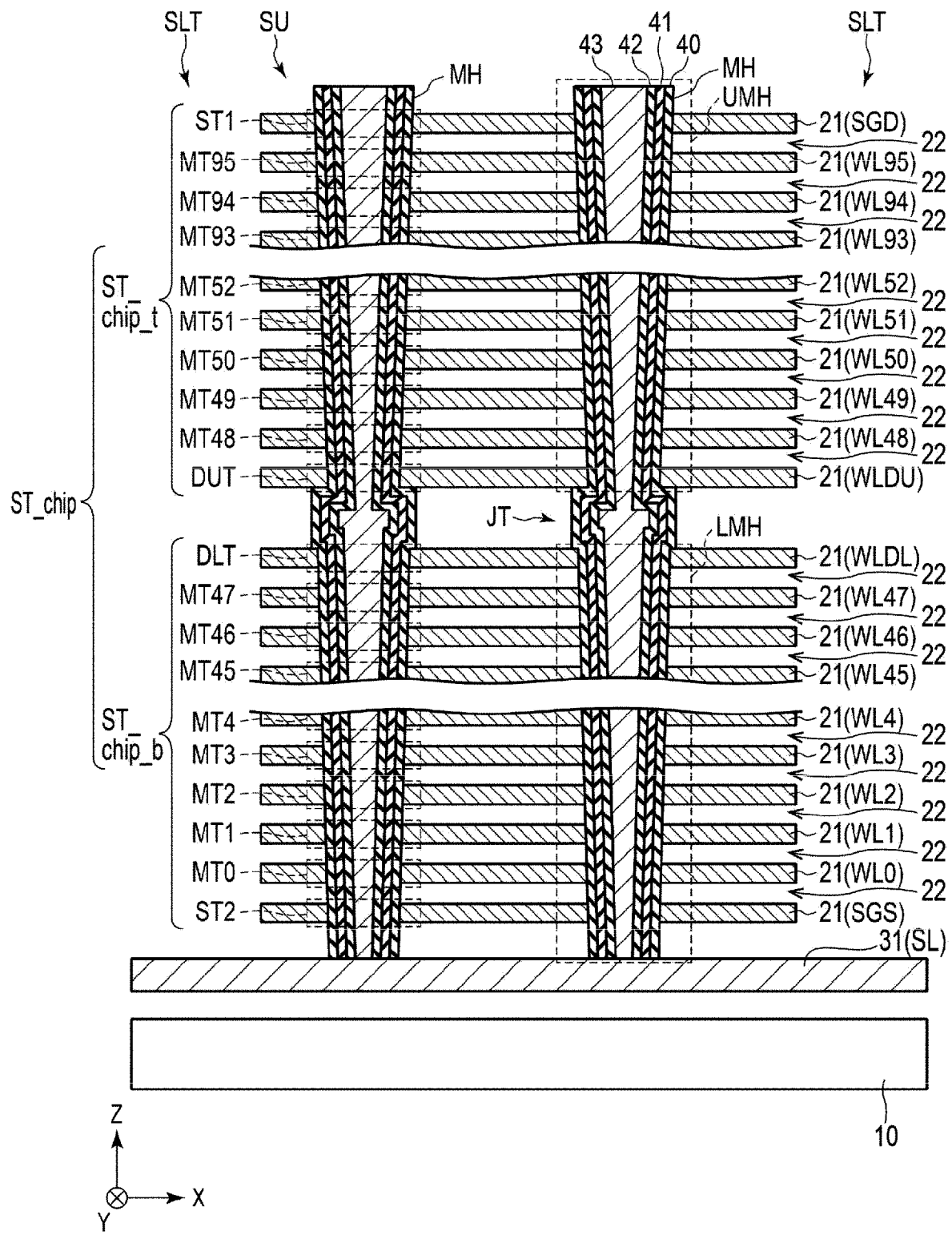
FIG. 16 is a cross-sectional view of a chip region of a semiconductor storage device according to the second embodiment.

FIG. 16 is a cross-sectional view of the chip region Rchip of a semiconductor storage device according to the second embodiment.

In the first embodiment described with reference to FIG. 6, the distance between the conductive films 21 is substantially constant from the lower stacked body ST_chip_b to the upper stacked body ST_chip_t. In the second embodiment, as compared with the first embodiment, the distance between the uppermost conductive film 21 in the lower stacked body ST_chip_b and the lowermost conductive film 21 in the upper stacked body ST_chip_t is increased by the gap GP.

The outer diameter of the joint portion JT is, for example, larger than the outer diameter of the contact portion between the lower pillar LMH and the joint portion JT, and larger than the outer diameter of the contact portion between the upper pillar UMH and the joint portion JT. The distance in the Z direction (distance between the dummy word lines WLDL and WLDU) of the junction layer provided with the joint portion JT is wider than the distance between adjacent word lines among the word lines WL0 to WL47 and WL48 to WL95.

As in the second embodiment, the gap GP may be provided between the lower stacked body ST_b and the upper stacked body ST_t.

The width (thickness) of the gap GP in the Z direction may be smaller (thinner) than the spacing between the second insulating films 23. Normally, the distance between the conductive films 21 in the second stacked body ST_chip_1 having one stage is almost the same. On the other hand, the distance between the uppermost conductive film 21 in the lower stacked body ST_chip_b and the lowermost conductive film 21 in the upper stacked body ST_chip_t may be larger or smaller than the distance between the conductive films 21 in a one-stage stacked body.

The semiconductor device 100 (semiconductor chip C) according to the second embodiment can obtain the same effect as that of the first embodiment.

Third Embodiment

Figure 17:
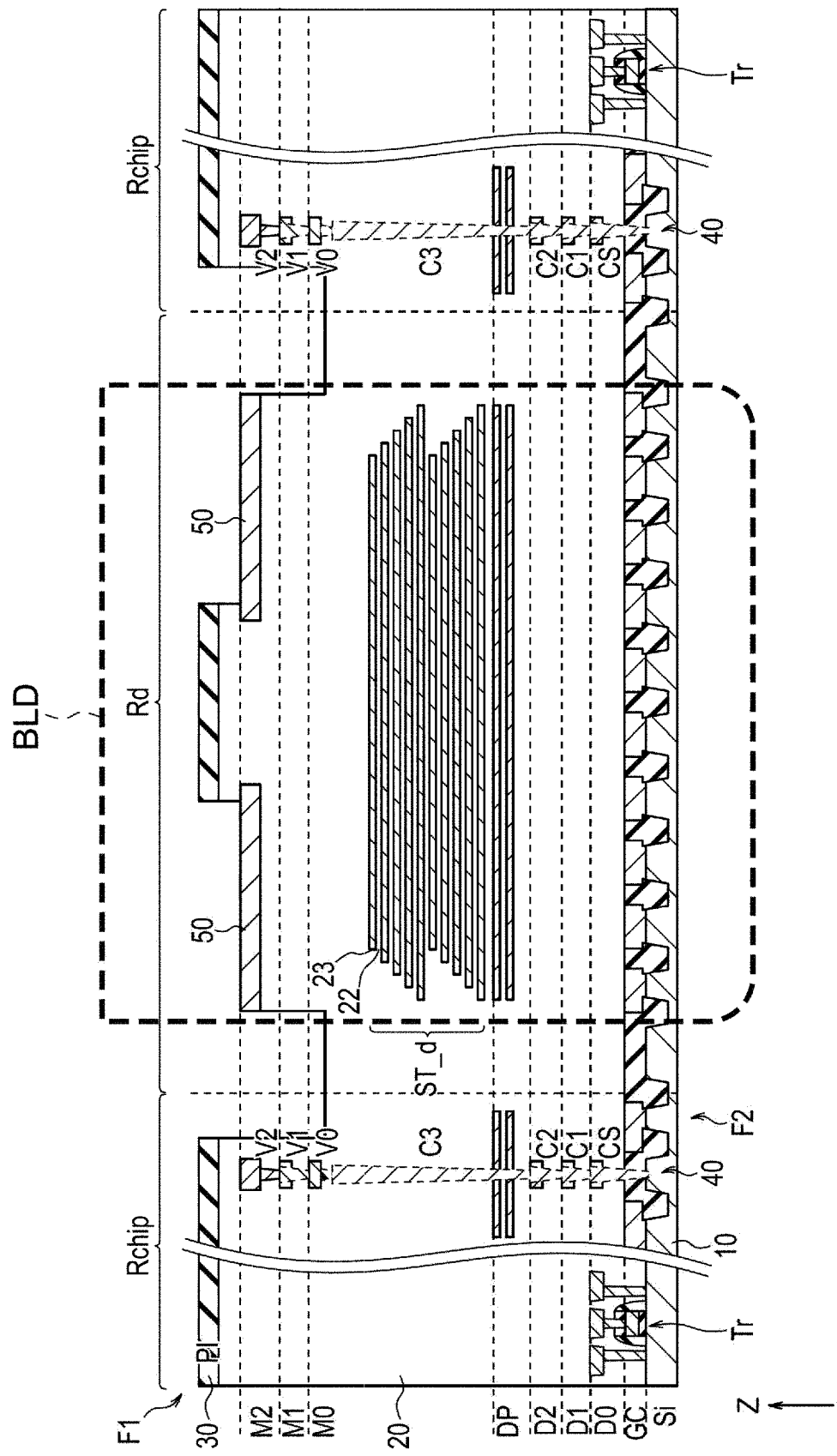
FIG. 17 is a cross-sectional view showing an example of a configuration of a semiconductor wafer according to a third embodiment.

FIG. 17 is a cross-sectional view showing an example of the configuration of the semiconductor wafer W according to a third embodiment. In the third embodiment, the interlayer insulating film 20 is disposed between the stacked body ST_d and the semiconductor substrate 10. In FIG. 17, the stacked body ST_chip is omitted. The semiconductor substrate 10 may be a Si substrate.

The stacked body ST_d is disposed above the interlayer insulating film 20 of the same layer as wiring layers GC and D0 to D2 in which the control circuit 11 is disposed. The control circuit 11 includes a CMOS circuit composed of a transistor Tr.

The transistor Tr is electrically connected to the wiring of the wiring layer D0 and the wiring of the wiring layers D1 and D2 (not shown). Power is supplied to the transistor Tr via the wiring of the wiring layers D0 to D2. The gate electrode of the transistor Tr is provided as a wiring layer GC. A wiring layer DP is provided in the upward direction of the wiring layer D2. The wiring layer DP is a conductive layer containing polysilicon, and may be used as a source layer of a memory transistor.

The guard ring 40 includes, for example, wirings of wiring layers M0 to M2 and D0 to D2, and contacts C1 to C3, Cs, vias V0 to V2, and the like.

As in the third embodiment, the interlayer insulating film 20 may be disposed between the stacked body ST_d and the semiconductor substrate 10.

The semiconductor device 100 (semiconductor chip C) according to the third embodiment can obtain the same effect as that of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a semiconductor chip including (i) a first surface, (ii) a second surface opposite to the first surface, (iii) a third surface between the first and second surfaces, and (iv) a side surface connecting the first surface to the third surface, wherein the semiconductor chip further includes:
a semiconductor substrate,
a semiconductor element disposed on the semiconductor substrate and disposed in a center portion of the semiconductor chip when viewed from a normal line direction of the first surface, and
an insulating film disposed on the semiconductor substrate, the insulating film exposed to the side surface along an outer edge of the semiconductor chip when viewed from the normal line direction of the first surface, wherein
the semiconductor element includes a plurality of stages of second stacked bodies, the plurality of stages of second stacked bodies having a plurality of first material films and a plurality of conductive films that are alternately stacked, in the normal line direction.

2. The semiconductor device according to claim 1, wherein
a height of the exposed side surface is 4.5 μm.

3. The semiconductor device according to claim 1, wherein
a stacked body, having the plurality of first material films and a plurality of second material films that are alternately stacked, is not exposed on the side surface.

4. The semiconductor device according to claim 3, wherein
the first material film is a silicon oxide film, and
the second material film is at least one of a silicon nitride film, a tungsten (W) film, or a phosphorus-doped polysilicon film.

5. The semiconductor device according to claim 1, wherein
the semiconductor element includes:
a second lower stacked body having the plurality of first material films and the plurality of conductive films that are alternately stacked,
a lower columnar portion that penetrates the second lower stacked body in the normal line direction,
a second upper stacked body disposed on the second lower stacked body, the second upper stacked body having the plurality of first material films and the plurality of the conductive films that are alternately stacked, and
an upper columnar portion disposed on the lower columnar portion and penetrating the second upper stacked body in the normal line direction, wherein
widths of the lower columnar portion and the upper columnar portion decrease from an upper end to a lower end, and
a width of the upper end of the lower columnar portion is larger than a width of the lower end of the upper columnar portion.

6. The semiconductor device according to claim 1, wherein
the insulating film has a width of a second predetermined value or more from the side surface along the outer edge toward the semiconductor element.

7. The semiconductor device according to claim 6, wherein
the second predetermined value is 3 μm.

8. The semiconductor device according to claim 1, wherein
the side surface has a predetermined surface roughness.

9. The semiconductor device according to claim 1, wherein the semiconductor device includes a memory cell array.

10. The semiconductor device according to claim 1, wherein the semiconductor chip further includes a fourth surface between the first and third surfaces, and the fourth surface is connected to the third surface with another side surface.

11. The semiconductor device according to claim 10, wherein the first surface is overlaid by a passivation film and the fourth surface is overlaid by a metal film, while the third surface is overlaid by neither the passivation film nor the metal film.

* * * * *